(12) United States Patent
Retschke et al.

(10) Patent No.: US 7,259,777 B2
(45) Date of Patent: Aug. 21, 2007

(54) SCANNER SYSTEM

(75) Inventors: Wolfgang Retschke, Jena (DE); Wolfgang Senf, Jena (DE); Steffen Rucker, Grosslobichau (DE); Uwe Klowsky, Jena (DE); Udo Battig, Jena (DE); Ulrich Baumann, Jena (DE)

(73) Assignee: Laser Imaging Systems GmbH & Co. KG, Jena (DE)

( * ) Notice: Subject to any disclaimer, the term of this patent is extended or adjusted under 35 U.S.C. 154(b) by 0 days.

(21) Appl. No.: 11/276,516

(22) Filed: Mar. 3, 2006

(65) Prior Publication Data

US 2006/0132590 A1 Jun. 22, 2006

Related U.S. Application Data

(62) Division of application No. 09/581,377, filed as application No. PCT/EP99/01764 on Mar. 15, 1999, now Pat. No. 7,046,266.

(30) Foreign Application Priority Data

Jul. 4, 1998 (DE) ................. 198 29 986

(51) Int. Cl.
B41J 2/435 (2006.01)
(52) U.S. Cl. .................................... 347/227
(58) Field of Classification Search ............... 347/227, 347/262–264; 226/95, 170; 269/21, 316, 269/317; 432/253; 324/754; 248/362; 200/19.24, 200/19.25; 355/72–77
See application file for complete search history.

(56) References Cited

U.S. PATENT DOCUMENTS

| | | | |
|---|---|---|---|
| 4,205,348 A | 5/1980 | DeBenedictis | |
| 4,212,018 A | 7/1980 | Ohnishi et al. | |
| 4,244,005 A | 1/1981 | Jurgensen | |
| 4,445,125 A | 4/1984 | Scifres et al. | |
| 4,451,854 A | 5/1984 | Daigo | |
| 4,566,043 A | 1/1986 | Tamura | |
| 4,667,155 A * | 5/1987 | Coiner et al. | ............... 324/754 |
| 4,695,044 A * | 9/1987 | Nishihama et al. | ........... 269/21 |
| 4,721,462 A * | 1/1988 | Collins, Jr. | ................. 432/253 |
| 4,742,401 A | 5/1988 | Andree et al. | |
| 4,759,613 A | 7/1988 | Fox | |
| 4,826,268 A | 5/1989 | Kramer | |
| 4,946,234 A | 8/1990 | Sasada et al. | |
| 5,012,089 A | 4/1991 | Kurusu et al. | |
| 5,191,442 A | 3/1993 | Ferrara et al. | |

(Continued)

FOREIGN PATENT DOCUMENTS

EP 0299 455 1/1989

(Continued)

OTHER PUBLICATIONS

Goutzoulis, A. et al.; "Design of Acousto-optic Deflector"; Design and Fabrication of Acousto-optic Devices; Marcel Dekker, Inc.; pp. 97-103; 1994.

(Continued)

Primary Examiner—Hai Pham
(74) Attorney, Agent, or Firm—Sughrue Mion, PLLC

(57) ABSTRACT

Apparatus for holding flat plates of varying sizes, including a base section having a flat surface and including plurality of interconnected channels formed on the surface thereof; at least one port connecting to the channels; a vacuum source connected to the at least one port; and an intermediate plate covering substantially all of the channels and having a multiplicity of holes formed therethrough, the holes being arranged to be covered by a flat plate that is to be held to the flat surface.

5 Claims, 21 Drawing Sheets

U.S. PATENT DOCUMENTS

| | | |
|---|---|---|
| 5,342,715 A | 8/1994 | Kamath et al. |
| 5,371,608 A | 12/1994 | Muto et al. |
| 5,463,418 A | 10/1995 | Tateoka |
| 5,486,932 A | 1/1996 | Leonard |
| 5,495,279 A | 2/1996 | Sandstrom |
| 5,576,880 A | 11/1996 | Chang |
| 5,608,444 A | 3/1997 | Takano |
| 5,635,976 A | 6/1997 | Thuren et al. |
| 5,706,994 A * | 1/1998 | Welch et al. ............... 226/95 |
| 5,883,732 A | 3/1999 | Takada et al. |
| 5,923,359 A | 7/1999 | Montgomery |
| 6,037,967 A | 3/2000 | Allen et al. |
| 6,052,140 A | 4/2000 | Yoshida |
| 6,182,957 B1 * | 2/2001 | Becker ....................... 269/21 |

FOREIGN PATENT DOCUMENTS

| | | |
|---|---|---|
| EP | 0 679 520 | 11/1995 |
| WO | WO98/27450 | 6/1998 |

OTHER PUBLICATIONS

Goutzoulis, A. et al.; "Design of Acousto-optic Deflector"; Design and Fabrication of Acousto-optic Devices; Marcel Dekker, Inc.; pp. 190-192 respectively; 1994.

* cited by examiner

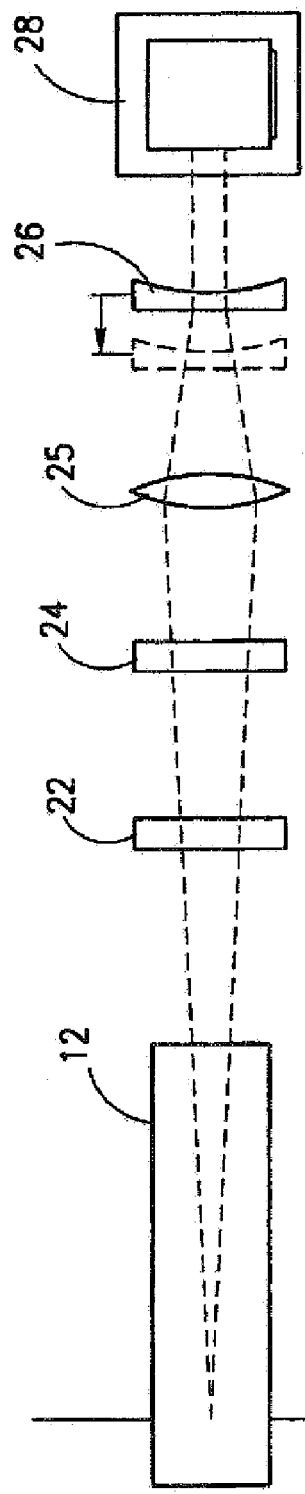
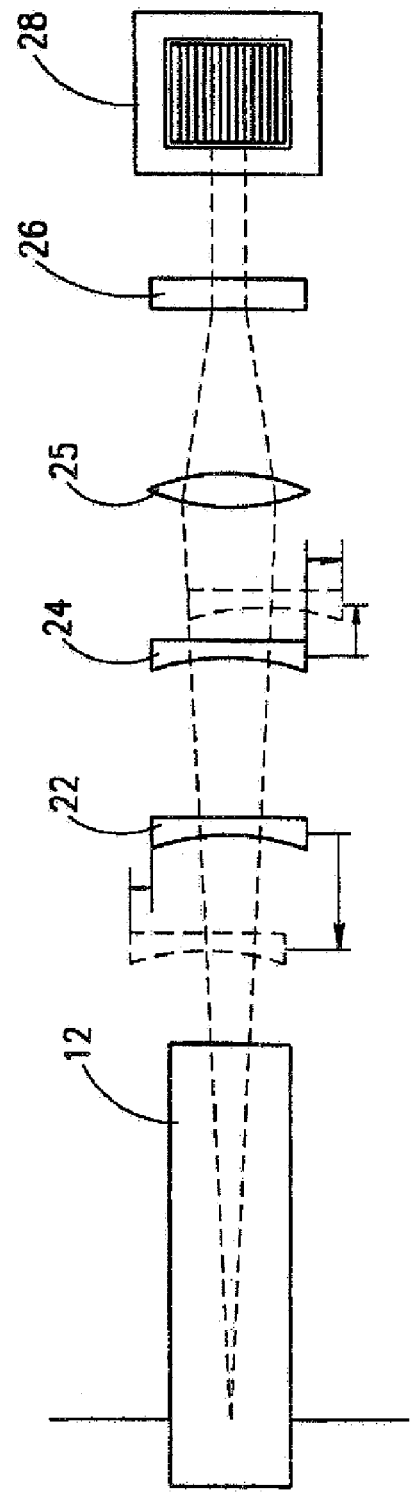
FIG.7A
FIG.7B

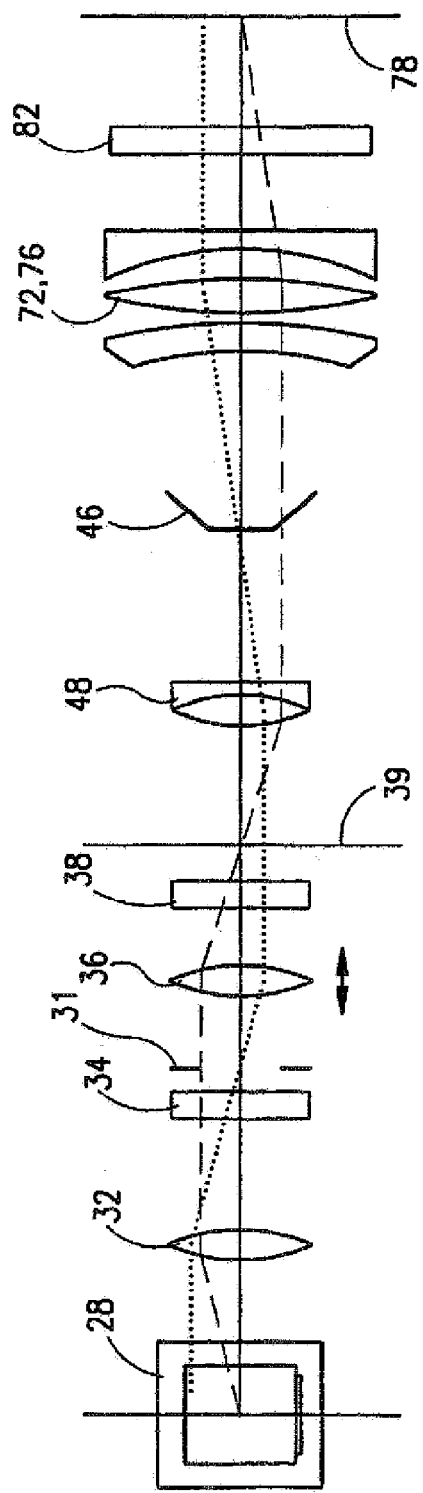
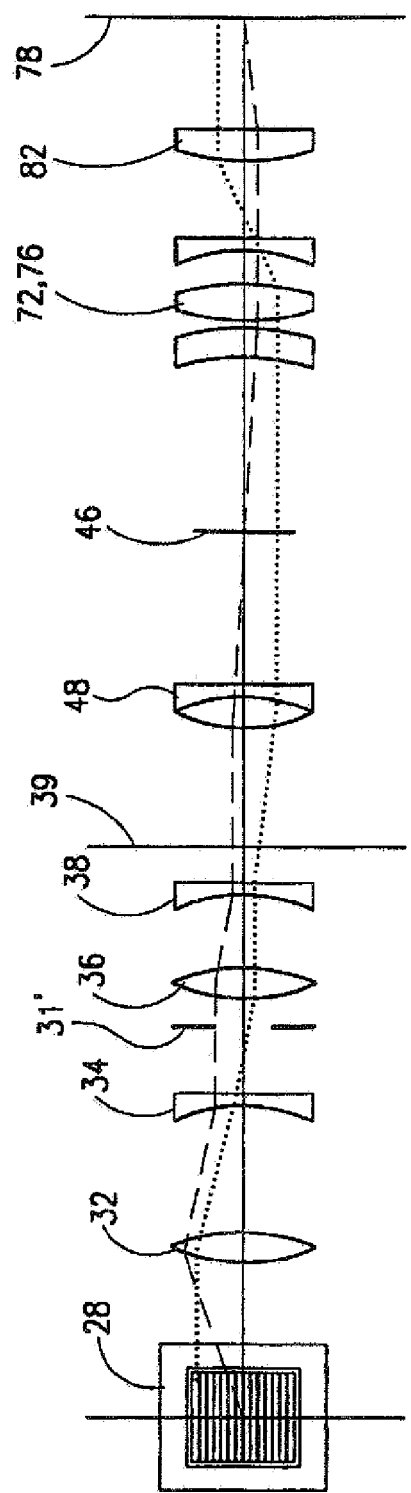
FIG.8A
FIG.8B

SCANNER SYSTEM

CROSS REFERENCE TO RELATED APPLICATIONS

This application is a divisional application of application Ser. No. 09/581,377 filed Mar. 29, 2001, now U.S. Pat. No. 7,046,266, which is a National Stage Entry of PCT International Application PCT/EP99/01764, filed Mar. 15, 1999 and published under WO0002424; which claims the benefit of German Application 198 29 986.9 filed on Jul. 4, 1998. The above noted prior applications are all hereby incorporated by reference in their entirety.

FIELD OF THE INVENTION

The present invention is related to methods for scanning surfaces, for example for writing on the surfaces with a scanning laser beam. In particular, a system for direct writing of patterns on printed circuit boards is disclosed.

BACKGROUND OF THE INVENTION

Most printed circuit boards are produced by first coating a printed circuit board substrate, having a solid copper cladding, with a photoresist material. When selectively exposed and developed, part of the photoresist is removed and the remaining photoresist forms a pattern corresponding to the light and dark areas of the illumination. After formation of the developed photoresist pattern, the copper cladding is typically subjected to an etching step in which that part of the copper cladding that is not coated by the photoresist is removed.

In the main, one of two methods of selectively exposing the photoresist is used. One method utilizes a master, such as a film, on which the required pattern (or its inverse) is formed. The photoresist coating is exposed to strong illumination, through this film. The exposed board is then developed and etched as described above. For highly precise patterns with small object sizes, this method has a number of significant drawbacks. Firstly, the films may stretch or otherwise distort. This stretching causes sometimes significant variations between the sizes and positions of the patterns formed on various layers of a multilayer or double sided board. Second, the wear and tear on the films requires frequent changing the films. Third, any changes in the layout require a new set of films and often several new sets of films. Finally, it is difficult to compensate for small variations in sizing that occur during processing of the boards.

A second method, which is the subject of the present invention, utilizes a scanning laser beam to scan the photoresist coating to write the pattern thereon. This method is known as the "direct writing" method. In principle, direct writing overcomes many of the drawbacks of the prior art. In practice, conventional direct writing methods often have problems of their own. In particular, conventional direct writing systems are generally much slower than the film exposure methods and require much higher capital expenditure. Although, in principle, the accuracy and resolution of direct writing is high, many practical considerations, such as the ability to speedily deliver high energy radiation to expose the photoresists, have limited the throughput as well as the actual accuracy and precision of boards produced by conventional direct writing methods.

It is known in the art to scan a printed circuit board with a plurality of beams to increase the scanning speed of direct writing systems. In general such multi-beam scanning is utilized in a number of fields such as in the preparation of reticules for the printed circuit industry and in electrophotographic printing machines. However, in such applications the power requirements are low and the size of the objects scanned is generally relatively small.

U.S. Pat. No. 5,635,976 describes a system for improved feature definition in producing reticules. In this system the reticule is scanned utilizing a beam address at a resolution at least four times as high as the object pixel resolution. A single laser scan line or multiple scan lines are disclosed.

U.S. Pat. No. 5,495,279 describes a system for exposure of patterns for very large device. In this device an oval laser beam is used. The beam is segmented into at least 100 parallel segments, each of which is separately addressable, such that 100 lines of pixels may be written together.

A further requirement of direct writing systems is that the system know exactly where on the written surface the beam is situated at any time. One way of making this determination is to boresight a test beam with the writing beam. The test beam is separated from the writing beam prior to the impingement of the writing beam on the surface of the printed circuit board. A scale selectively reflects a portion of the test beam. The reflected beam is then detected and the detected signal is used as the basis for a data clock. However, in order to provide for ease of boresighting and especially for separation of the boresighted beams, the beams are of different wavelengths. Unfortunately, beams of different wavelengths are affected differently by the optics and do not track perfectly. Furthermore, only a portion of the relevant path is traversed by both beams and the f-θ lens typically used in such scanners is not fully traversed by both beams. One such system is the LIS DirectPrint 40 of Laser Imaging Systems GmbH of Jena, Germany.

Direct writing systems generally operate with printed circuit boards of various thicknesses. While optical focusing of light is well known, it is not used for direct writing systems due to the complexity of the optics. Therefore, prior art systems utilize a table whose height is variable. For different heights of board, the height of the table is adjusted such that the surface of the board is in focus at a predetermined focal plane. However, especially for large boards, such a table is mechanically complicated, especially if other mechanical adjustments, such as angle of the board with respect to the table, must be made.

Rasterized laser scanning systems typically suffer from inaccuracies caused by the polygon used to scan the beam. Wobble cause random errors in the writing of the laser beam in the cross-scan direction. Imperfections in the scanner optics causes other, usually systematic errors.

Generally, it is important to precisely position the optical exposure of the photoresist (and the subsequent etched pattern) on the board. While this is not very important for single sided inner layers of composite boards for outer layers formed on already laminated boards and for double sided boards, in which holes are drilled to connect features within the board or on opposite sides of the board or layer, the exact placement of the patterns is imperative. This can be achieved by referencing the scan data to predetermined features, for example for inner layers, referencing to features that appear on both sides of the board. One such normally used feature is a drilled hole. In general, an unwritten board has one or more drilled holes present in the board, which holes mate with pins on the scanner. For double sided inner layers, scanning is thus referenced to the holes for both sides of the board.

However, such a system is not wholly satisfactory. The accuracy possible with pin alignment is relatively limited, as compared with the required printed circuit element resolutions. Attempts to reduce the tolerances of the holes to the pins results in damage to the holes and subsequent poor alignment.

SUMMARY OF THE INVENTION

One aspect of some preferred embodiments of the present invention is concerned with a scanning method in which a beam, comprising a multiplicity of independently addressable segments, is used to scan a surface, such as a photoresist coated surface of a printed circuit board.

In some preferred embodiments of the invention having this aspect, a beam having an oblong beam (hereinafter, an oblong beam) scans the surface. This beam is divided into a predefined number of separately addressable segments, each of which is several times smaller than the minimum size of features to be written on the surface. Each of these segments denotes a sub-beam or scan line. Thus, large number of very thin sub-beams (each identified with an addressable segment) scan the surface together in parallel scan lines. However, in contrast to the prior art systems, the areas are scanned in successive overlapping scans of the oblong beam.

In some preferred embodiments of the invention, the spacing of the scan lines is substantially less than a minimum size of a pattern feature to be written on the surface. Thus, for these embodiments, each minimum feature dimension is written by a number of parallel separately addressable scan lines. Each of the sub-beam paths on the printed circuit board is exposed multiple times, during successive scans of the oblong beam.

Preferably, the oblong beam does not have uniform power in its long direction. Rather, in order to increase the power utilization of the system, the beam profile has a Gaussian shape in this direction, with only low power tails of the Gaussian being unused. Furthermore, in preferred embodiments of the invention, each of the sub-beams is diffraction limited such that the width exposed by a scan line is substantially greater than the center-to-center distance between the scan lines. In some embodiments of the invention, the sub-beams are two or three times as wide as the distance between the separately addressable sub-beams, at the surface on which the data is being written.

In an aspect of some preferred embodiments of the invention, an optimum scanning speed is provided for different sensitivities of photoresist. In general, a scanner may be used for a number of different types of photoresist of varying sensitivity. In principle, the scanning speed could be matched to the sensitivity by varying the scanning speed inversely with the speed of the photoresist. However, most large scanners utilize a large polygon scanner, which operates best over a relatively restricted range of speeds. Thus, in the prior art, in addition to possibly changing the scanning speed, it was necessary to reduce the laser power when scanning a high-speed photoresist. In this way, much of the sensitivity advantage of the photoresist would be lost.

In a preferred embodiment of the invention, in addition to the variation in speed of the scan as in prior art devices, the amount of overlap of successive swaths is varied, depending on the power requirements of the photoresist. Thus, for slow photoresist, the overlap is increased (by reducing the speed of movement of the printed circuit board). For faster photoresist, not only is the scan speed increased somewhat, but the amount of overlap is decreased. Thus, over a relatively wide range of powers the laser power is kept at a high, preferably a constant, optimized, level. This results in an optimum scanning speed and optimum power utilization for a wide variety of photoresist speeds.

An aspect of some preferred embodiments of the invention relates to improved determination of the position of the beam as it scans.

In a preferred embodiment of the invention, the testing beam is at the same wavelength as at least one spectral line of the writing beam. Furthermore, the testing beam is preferably derived from the same laser source that produces the writing beam, preferably by providing a splitter near the output of the source. In a preferred embodiment of the invention, the two beams travel parallel or nearly parallel paths for most of their length. In particular, the testing beam travels through all of the scanning optics (starting at least from the polygon) including, preferably, the f-θ lens. However, in a preferred embodiment of the invention, the two beams are not parallel. Rather they both lie in a plane that is perpendicular to the scan direction. Although the beams are neither boresighted nor parallel, they both travel through the same scanning optics and are nearly identically deflected. Thus, measurements made on the position of the test beam accurately reflect the position of the writing beam.

In a preferred embodiment of the invention, a measurement scale is situated after the f-θ lens, offset (in the cross-scan direction) from the writing beam. The test beam, which travels at an angle to the writing beam, is reflected from the scale, while the writing beam misses the scale and impinges on the photoresist. The scale includes markers which modulate the reflected beam. This modulation is detected and forms the basis for the data clock.

Other aspects of some preferred embodiments of the invention are concerned with aspects of the optical system. One such aspect is an ability to optically focus the beam on the photoresist to accommodate different thicknesses of printed circuit board. As indicated in the background of the invention, the complexity of the system requires that substantial care be taken to allow for such focusing.

In accordance with an aspect of some preferred embodiments of the present invention, alignment of the data to the board is with reference to through holes, as in the prior art. However, unlike the prior art systems in which the holes were mechanically aligned with the scanner, in preferred embodiments of the invention, the holes are optically aligned with the scan data.

In a preferred embodiment of the invention, the system used for writing on the printed circuit board, including the scan and cross-scan positioning mechanism, is utilized for determining the precise position of the holes, and hence of the board, on the scanner table. In preferred embodiments of the invention, the data is matched to the position of the board by rotating the board to correct for angular misalignment of the board with the data. Alternatively or additionally, selective delay of the scan line data corrects for residual scan positional misalignment. Preferably, cross-scan misalignment is corrected by delaying or advancing the data in the cross-scan direction. Generally, all three corrections are carried out.

In an alternate preferred embodiment of the invention, the data itself is transformed to the measured coordinate system by rotating and translating the data to match the measured position. However, it is difficult to make these transformations on-line, so that the hybrid alignment of the data with the position, described above, is preferred.

In an aspect of some preferred embodiments of the invention, the size of the image to be scanned is adjusted by comparing the actual distance between holes in the board to a predetermined distance.

In some preferred embodiments of the invention, a scaling operation is performed in one direction. In others, it is performed in both directions based on a distance measurement in one direction. In others, it is performed in both directions based on distance measurements in both directions.

In an aspect of some preferred embodiments of the invention, the board is fixedly held using a vacuum chuck. The vacuum chuck is a part of the table on which the printed circuit board is mounted. The chuck is preferably universal in the sense that its basic structure is suitable for all boards. Preferably, a simple pierced sheet of metal is provided to adapt the universal portion of the chuck to particular boards.

Other aspects of the invention will become clear from the following detailed description of the invention, together with the appended claims.

There is therefore provided in accordance with a preferred embodiment of the invention, a method of scanning for writing a pattern on a surface, comprising:

providing a scanning beam comprised of a plurality of independently addressable sub-beams;

scanning the surface with said scanning beam a plurality of times, said sub-beams scanning the surface side-by side in the cross-scan direction, each said sub-beam being modulated to reflect information to be written; and overlapping the beams such that all written areas of the surface are written on during at least two scans. Preferably, said written areas are written on at least three times. Alternatively, said written areas are written on at least four times. Alternatively, said written areas are written on at least six times. Alternatively, said written areas are written on at least eight times. Alternatively, said written areas are written on at least twelve times. Alternatively, said written areas are written on at least twenty four times.

In a preferred embodiment of the invention, the beam is formed by separately modulating individual segments of an oblong beam and said segments comprising said sub-beams. Preferably, separately modulating comprises:

providing an oblong beam having a usable extent in the long direction; and providing a plurality of modulation segments along said long direction, the total extent of said segments being greater than the usable extent.

Alternatively, the sub-beams are separately produced and the method includes combining the sub-beams to form said beam.

In a preferred embodiment of the invention, the unmodulated energy of at least two of the separately addressable sub-beams is different. Preferably, the unmodulated energy has a generally Gaussian profile. Alternatively or additionally, the modulation of the beam is binary, on-off modulation.

In a preferred embodiment of the invention, a pattern having a minimum feature size is written and the spacing of the sub-beams is substantially smaller than the feature size. Preferably, the minimum feature size is at least four times as large as the extent of the sub-beams. Alternatively or additionally, the minimum feature size is less than or equal to about 77 micrometers. Alternatively or additionally, the minimum feature size is less than or equal to about 51 micrometers. Alternatively or additionally, the minimum feature size is less than or equal to about 39 micrometers.

In a preferred embodiment of the invention, the sub-beams are spaced by a predetermined distance at said surface and the sub-beams have an extent at the surface in the direction of adjacent beams and the extent is greater than the spacing. Preferably, the spacing is less than about 15 micrometers. Alternatively, the spacing is less than about 10 micrometers. Alternatively, the spacing is about 6.35 micrometers.

In a preferred embodiment of the invention, the spacing is less than about 6.35 micrometers.

In a preferred embodiment of the invention, the extent is at least twice the spacing. Preferably, the extent is at least three times the spacing. Alternatively or additionally, the extent is more than about 6.35 micrometers. Alternatively or additionally, the extent is greater than or equal to about 12.7 micrometers. Alternatively or additionally, the extent is greater than or equal to about 19 micrometers. Alternatively or additionally, the extent is greater than or equal to about 25.4 micrometers.

There is also provided in accordance with a preferred embodiment of the invention, a method of optimizing throughput in a scanning system while selectively delivering a variable desired level of energy to the surface, comprising:

scanning a surface in accordance with any of the preceding claims to provide exposed areas and unexposed areas in accordance with modulation of the sub-beams;

providing said beam at a given optimized power;

determining a combination of parameters including (1) beam scanning velocity between a maximum and minimum velocity, said maximum and minimum velocities defining a scanning velocity ratio; (2) a speed of relative movement of the surface and the beams in a direction normal to the scan; and (3) a beam overlap suitable for exposing the exposed surface areas to the desired energy with the beam at optimized power; and exposing the surface utilizing the determined combination of parameters. Preferably, the method includes selectively varying the energy delivered to exposed areas on the board by a ratio substantially greater than the scanning velocity ratio, by varying the parameters.

There is also provided in accordance with a preferred embodiment of the invention, a method of optimizing throughput in a scanning system while selectively delivering a variable desired level of energy to the surface, comprising providing a beam at a given optimized power;

modulating the beam;

scanning the beam across the surface in a first direction with a first velocity, between a maximum and minimum velocity, said maximum and minimum velocities defining a scanning velocity ratio;

relatively moving the surface and the scanning beam on a second direction normal to the first direction at a second velocity; and selectively varying the energy delivered to exposed areas on the board by a ratio substantially greater than the scanning velocity ratio.

In a preferred embodiment of the invention, the energy delivered is varied by a factor at least one and on-half times as high as the scanning velocity ratio. Alternatively or additionally, the energy delivered is varied by a ratio at least three times as high as the scanning velocity ratio. Alternatively or additionally, the energy delivered is varied by a ratio at least five times as high as the scanning velocity ratio. Alternatively or additionally, the energy delivered is varied by a ratio at least ten times as high as the scanning velocity ratio.

In a preferred embodiment of the invention, the scanning velocity ratio is no greater than 1.5. Alternatively or additionally, the scanning velocity ratio is no greater than 2.

There is also provided in accordance with a preferred embodiment of the invention, a method of determining the position of a surface in relation to a scanning beam in a scanner, the method comprising:

providing the surface with at least two holes;

scanning the surface at least in the vicinity of the holes with the beam;

detecting the beam when it is in positions at which it passes through the holes;

determining positions, in a scanner reference frame, of the beam at least at those positions where the beam is at an edge of the hole; and determining the positions of the holes, in the scanner reference frame, based on a determination of the positions of the edges of the holes. Preferably, the position of the edges of the hole are determined over the entire circumference of the holes. Alternatively or additionally, the method includes:

determining a distance between the two holes;

comparing the determined distance to a design distance; and determining a scaling factor for data to be written on the surface by the scanner from said comparison. Preferably, the method includes:

providing at least one additional hole in the surface positioned non-colinearly with the at least two holes;

determining the position of the at least one additional hole;

determining a further distance between the at least one additional hole and at least one of the at least two holes;

comparing said further distance with a design further distance; and determining at least one scaling factor for data to be written on the surface by the scanner from said comparison of the further distance and the design further distance. Preferably, determining the position of a hole comprises determining the positions of points on the edge of the hole and computing the position of the center of the hole based on the determined positions of the edge positions.

In a preferred embodiment of the invention, the method includes comparing the positions of the holes to a design position. Preferably, the method includes correcting one or both of the position of the surface and the positioning of data to be written on the surface based on said comparison. Preferably, correcting comprises rotating the surface. Alternatively or additionally, correcting comprises rotating the data. Alternatively or additionally, correcting comprises translating the relative positions of the surface or the data. Alternatively or additionally, the method includes correcting the size of data to be written on the surface based on said comparison.

In a preferred embodiment of the invention, detecting comprises detection utilizing a same detector for a plurality of holes and the detector receives energy passing through the holes via a light-guide. Preferably, light is transmitted to the detector from a plurality of holes, via a same light guide.

In a preferred embodiment of the invention, detecting comprises detecting utilizing a different detector for different holes.

In a preferred embodiment of the invention, the surface is determined from the position of the at least one hole. Preferably, the at least two holes comprise at lest three asymmetrically placed holes and the side of the surface is determined from the relative positions of the holes.

There is also provided in accordance with a preferred embodiment of the invention, a method of writing data in a scanner type writing system, comprising:

providing data for writing on a surface;

measuring the position of at least two features on a surface;

comparing a distance between the features to a design distance;

scaling the data based on the comparison; and writing the scaled data on the surface. Preferably, measuring comprises measuring the position of at least three non-collinear features and scaling comprises scaling in two directions with different scale factors. Alternatively or additionally, the features are through holes.

In a preferred embodiment of the invention, the surface is the surface of a metalized printed circuit board substrate coated with a photoresist material.

There is also provided in accordance with a preferred embodiment of the invention, a method of accommodating different thicknesses of printed circuit boards in a scanning type direct writing exposure system for printed circuit boards, comprising:

providing a metalized printed circuit board substrate coated with a photoresist material having a given thickness; and focusing a scanning beam on the photoresist material by changing the focus plane of the scanning beam. Preferably, the beam scans in a scanning direction and has a first extent in the scanning direction and a second, different, extent in the cross-scanning direction and including focusing the scanning beam in both directions at said surface. Preferably, scanning comprises providing an prescanned beam to a scanning element; and focusing comprises determining a common focus point for the scan and cross-scan directions of the prescanned beam; and changing the common focus point to effect focusing of the scanning beam on the coating. Preferably, changing the common focus point comprises changing the position of a lens. Preferably, changing the position comprises changing the position of a single lens.

In a preferred embodiment of the invention, providing a prescanned beam comprises separately modulating a plurality of beam segments disposed in the cross-scan direction and the modulated prescanned beam is in substantially in focus in both scan and cross scan directions for only a portion of its path. Preferably, the portion comprises substantially a point.

There is also provided in accordance with a preferred embodiment of the invention, apparatus for scanning a beam across a surface, comprising:

a first beam;

a modulator that receives a light beam at an optical input thereof, and produces a modulated light beam at an exit thereof, based on a modulation signal thereto;

a second beam;

a scanner that receives the first and second beams and scans the first beam across the surface and the second beam along a path substantially parallel to the path of the first beam; and a controller that provides said modulation signal responsive to the position of the second beam, characterized in that:

the first and second beams have substantially the same wavelengths. Preferably, the first beam includes energy at a wavelength different from the wavelength of the second beam. Alternatively or additionally, the apparatus includes a marked scale upon which the second beam impinges, such that the second beam is reflected therefrom to form a modulated reflected beam. Preferably, the second beam impinges the scale at an angle to its surface, such that the modulated reflected beam is reflected along an axis, different from that of the second beam.

There is also provided in accordance with a preferred embodiment of the invention, apparatus for scanning a beam across a surface, comprising:

a first beam;

a modulator that receives a light beam at an optical input thereof, and produces a modulated light beam at an exit thereof, based on a modulation signal thereto;

a second beam;

a scanner that receives the first and second beams and scans the first beam across the surface and the second beam along a path substantially parallel to the path of the first beam;

a controller that provides said modulation signal responsive to the position of the second beam; and a marked scale upon which the second beam impinges, such that the second beam is reflected therefrom to form a modulated reflected beam, characterized in that:

the second beam impinges the scale at an angle to its surface, such that the modulated reflected beam is reflected along an axis, different from that of the second beam.

In a preferred embodiment of the invention, the scanner comprises:

a scan device that receives a beam along a first axis and periodically rotates the beam axis to form a rotating beam; and an optical system that translates the periodic rotation into periodic lineal scanning of the beam, where the first and second beams are both scanned utilizing the scan device and the optical system. Preferably, the power of said beam varies as the beam axis rotates and the optical system includes a quasi f-θ lens system that varies the lineal speed of the linear scanning to compensate for the power variations.

There is also provided in accordance with a preferred embodiment of the invention, apparatus for scanning a beam across a surface, comprising:

a first beam;

a modulator that receives a light beam at an optical input thereof, and produces a modulated light beam at an exit thereof, based on a modulation signal thereto;

a second beam;

a scanner that receives the first and second beams and scans the first beam across the surface and the second beam along a path substantially parallel to the path of the first beam, the scanner comprising:

a scan device that receives a beam along a first axis and periodically angularly shifts the beam axis to form a rotating beam; and an optical system that translates the periodic rotation into periodic linear scanning of the beam; and a controller that provides said modulation signal responsive to the position of the second beam;

characterized in that: the first and second beams are both scanned utilizing the scan device and the optical system. Preferably, the optical system comprises a quasi-f-θ lens that provides non-linear tracking of linear beam position and angle.

In a preferred embodiment of the invention, the apparatus includes a marked scale upon which the second beam impinges, such that the second beam is reflected therefrom to form a modulated reflected beam. Preferably, the second beam impinges the scale at an angle to its surface, such that the modulated reflected beam is reflected along an axis, different from that of the second beam.

There is also provided in accordance with a preferred embodiment of the invention, apparatus for scanning a beam across a surface, comprising:

a first beam;

a modulator that receives a light beam at an optical input thereof, and produces a modulated light beam at an exit thereof, based on a modulation signal thereto;

a second beam;

a scanner that receives the first and second beams and scans the first beam across the surface and the second beam along a path substantially parallel to the path of the first beam;

a controller that provides said modulation signal responsive to the position of the second beam; and a marked scale upon which the second beam impinges, such that the second beam is reflected therefrom to form a modulated reflected beam, characterized in that:

the second beam impinges the scale at an angle to its surface, such that the modulated reflected beam is reflected along an axis, different from that of the second beam.

In a preferred embodiment of the invention, the controller provides said modulation, based on the modulations of the reflected beam. Alternatively or additionally, the apparatus includes a detector that receives said modulated reflected beam and generates a modulated signal therefrom, said controller providing said modulation, based on timing of said modulated signal. Preferably, the controller includes a clock generator that receives the modulated signal and generates a timing clock having a clock frequency that is controllably related to the frequency of the modulated signal. Preferably, the clock generator includes:

a first generator that generates an intermediate clock and an inverse intermediate clock having the same frequency and inverse phases; and switching circuitry having two inputs that receive the intermediate clock and the inverse intermediate clock respectively and a timing clock output to which the clock at one of the two inputs is selectively switched, such that the average frequency of the timing clock at the output is controlled by said selective switching. Preferably, the switching circuitry switches said inputs to said output responsive to clock correction information.

In a preferred embodiment of the invention, the apparatus includes a data store containing stored modulation information, which passes said information to said modulator for modulating the first beam, based on timing of said stable clock.

There is also provided in accordance with a preferred embodiment of the invention, apparatus for scanning a beam across a surface, comprising:

a modulated beam a scanner that receives the modulated beams and scans it across the surface, the scanner comprising:

a scan device that receives a beam along a first axis and periodically rotates the beam axis to form a rotating beam; and an optical system that translates the periodic rotation into periodic linear scanning of the beam;

characterized in that the optical system comprises a quasi-f-θ lens that provides non-linear tracking of linear beam position and angle, to compensate for variations of power in the beam as a function of angle. Preferably, the apparatus includes:

a modulator that receives a light beam at an optical input thereof, and produces the modulated light beam at an exit thereof, based on a modulation signal thereto;

a second beam, where the scanner receives the modulated and second beams and scans the second beam along a path substantially parallel to the path of the modulated beam; and a controller that provides said modulation signal responsive to the position of the second beam. Preferably, the apparatus includes a marked scale upon which the second beam impinges, such that the second beam is reflected therefrom to form a modulated reflected beam. Preferably, the second beam impinges the scale at an angle to its surface, such that the modulated reflected beam is reflected along an axis, different from that of the second beam. Alternatively or additionally, the markings on the scale are non-uniform to correct for systematic differences between the positions of the modulated and second beams.

There is also provided in accordance with a preferred embodiment of the invention, apparatus for holding flat plates of varying sizes and having, comprising:

a base section having a flat surface and including plurality of interconnected channels formed on the surface thereof;

at least one port connecting to said channels;

a vacuum source connected to the at least one port;

an intermediate plate covering all of said channels and having a multiplicity of holes formed therethrough, that are present only in areas of the flat surface without holes. Preferably, at least a portion of the base section comprises an array of truncated pyramids, flat tops of said pyramids comprising the flat surface and areas between the pyramids comprising the channels. Alternatively or additionally, the density of said holes is sufficient to hold said plate flat against said flat surface.

There is also provided in accordance with a preferred embodiment of the invention, scanning apparatus, for writing a pattern on a surface, comprising:

a beam, modulated by data;

a rotating polygon, comprising a plurality of facets that move as the polygon rotates;

a first optical system that focuses the beam at least in a cross-scan direction, on a facet, such that the beam is angularly scanned in a scan direction, as the polygon rotates;

a second optical system that receives the beam and focuses it on the surface, such that wobble of the polygon does not transfer as cross-scan deviations to the surface. Preferably, the beam is defocused in the scan direction on the polygon. Alternatively or additionally, the beam is focused in both scan and cross-scan directions on the surface. Alternatively or additionally, the second optical system transforms the angular sweep of the beam into a lineal sweep on the surface. Alternatively or additionally, the second optical system introduces systematic deviations in the cross-scan direction as a function of its position in the scan direction; and a data source that changes the data modulating the beam to compensate for the cross-scan deviations.

There is also provided in accordance with a preferred embodiment of the invention, scanning apparatus for writing a pattern on a surface in a series of passes, comprising:

at least one beam, modulated by at least one data signal;

a rotating polygon, comprising a plurality of facets that move as the polygon rotates;

an optical system that receives the at least one beam and focuses it on the surface, such that a pattern is written on the surface by the at least one beam, where the optical system introduces systematic deviations in the cross-scan direction as a function of its position in the scan direction; and a data source that changes the data modulating the beam to compensate for the cross-scan deviations.

In a preferred embodiment of the invention, the apparatus includes a multi-channel optical modulator that receives at least one beam, and modulates the at least one beam to form the modulated beam. Preferably, the apparatus includes a data store which stores a plurality of lines of data, said plurality of lines being greater than the number of independently modulated channels of the modulator and where data is sent to the modulator to modulate the beam from a line in response to the cross-scan deviation. Preferably, the data store also stores the dependence of the cross-scan deviation with scan position. Alternatively or additionally, the at least one beam comprises a plurality of beams.

There is also provided in accordance with a preferred embodiment of the invention, apparatus for writing a pattern on a radiation sensitive surface, comprising:

at least one laser beam having a predetermined intensity;

a modulator that receives the at least one beam at an input thereof and produces at least one modulated beam at an output thereof, and a scanner that scans the at least one modulated beam across the surface with a scanning velocity within a scan velocity range in a plurality of successive, partially overlapping swaths having a variable overlap within a range of overlaps, where the overlap and the scanning velocity are separately controllable, such that a range of power levels greater than that possible with either the range of overlaps or than the range of velocities may be delivered to the surface.

There is also provided in accordance with a preferred embodiment of the invention, an acousto-optic modulator comprising:

an input surface at which a beam enters the modulator, at which surface the beam is refracted by a first angle that is a function of the wavelength of the beam and the angle of incidence of the beam on the input surface;

an output surface at which the beam exits the modulator, at which surface the beam is refracted by a second angle that is a function of the wavelength of the beam and the angle of incidence of the beam on the output surface;

an acousto-optic Bragg diffracting region in which the beam is diffracted by a third angle when an acoustic wave is present, the third angle being a function of the wavelength of the beam, where at least the angle between the input and output surface is such that two input beams having given, different wavelengths, that are incident on the input surface at the same angle exit the output surface at the same angle.

There is also provided in accordance with a preferred embodiment of the invention, scanning apparatus, for writing a pattern on a surface, comprising:

a beam comprising energy at two distinct spectral lines, modulated by data; and an optical system that receives the beam and focuses it on the surface, such that a pattern is written on the surface by the at least one beam and such that the energy at both spectral lines is focused on the surface at the same position.

SHORT DESCRIPTION OF THE DRAWINGS

The present invention will be more clearly understood from the following detailed description of the preferred embodiments of the invention taken together with the following drawings, in which:

FIGS. 4A-4D show four scanning schemes in accordance with preferred embodiments of the invention;

FIGS. 6A-6C illustrate an alignment compensation of the scanner, in accordance with a preferred embodiment of the invention;

FIGS. 7A and 7B show two functional views of the main beam optics up to an acousto-optic modulator, in accordance with a preferred embodiment of the invention;

FIGS. 8A and 8B show two functional views of the main beam optics between the acoustooptic modulator and the printed circuit board, in accordance with a preferred embodiment of the invention;

DETAILED DESCRIPTION OF THE PREFERRED EMBODIMENTS

System Overview

Figure 1:
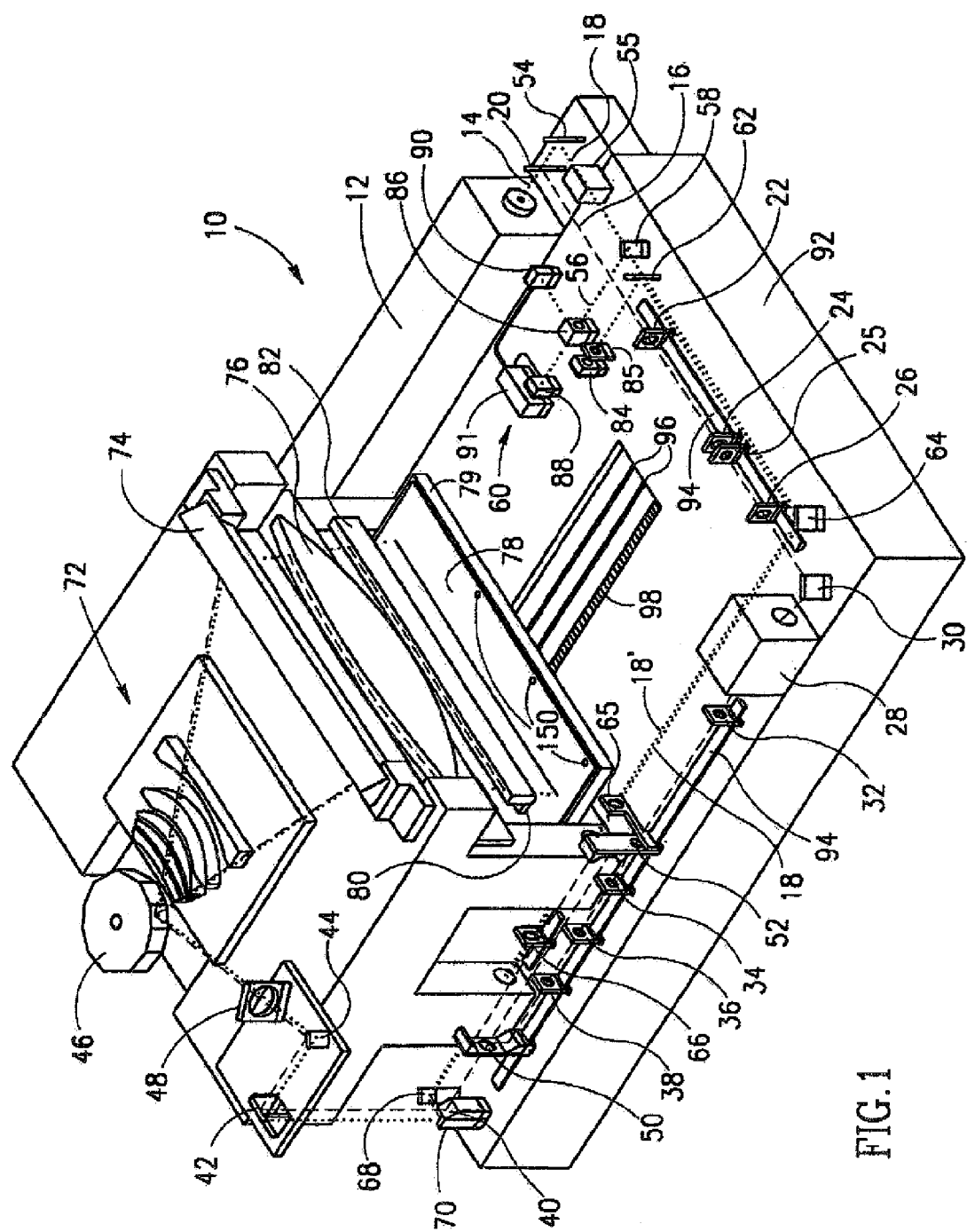
FIG. 1 is a schematic perspective view of a printed circuit board direct writing scanner in accordance with a preferred embodiment of the invention.
Figure 2:
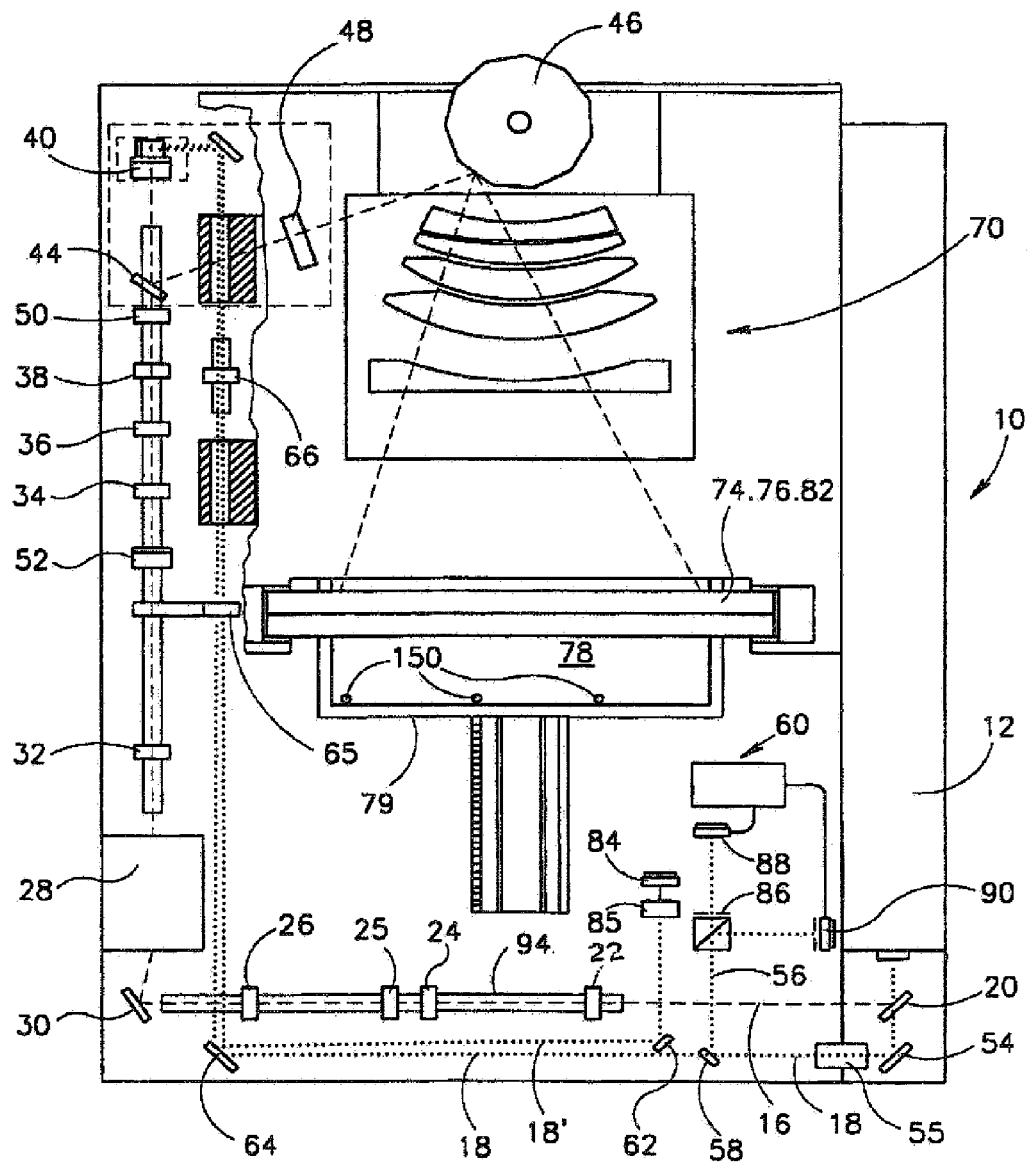
FIG. 2 is a schematic top view of the scanner of FIG. 1.
Figure 3:
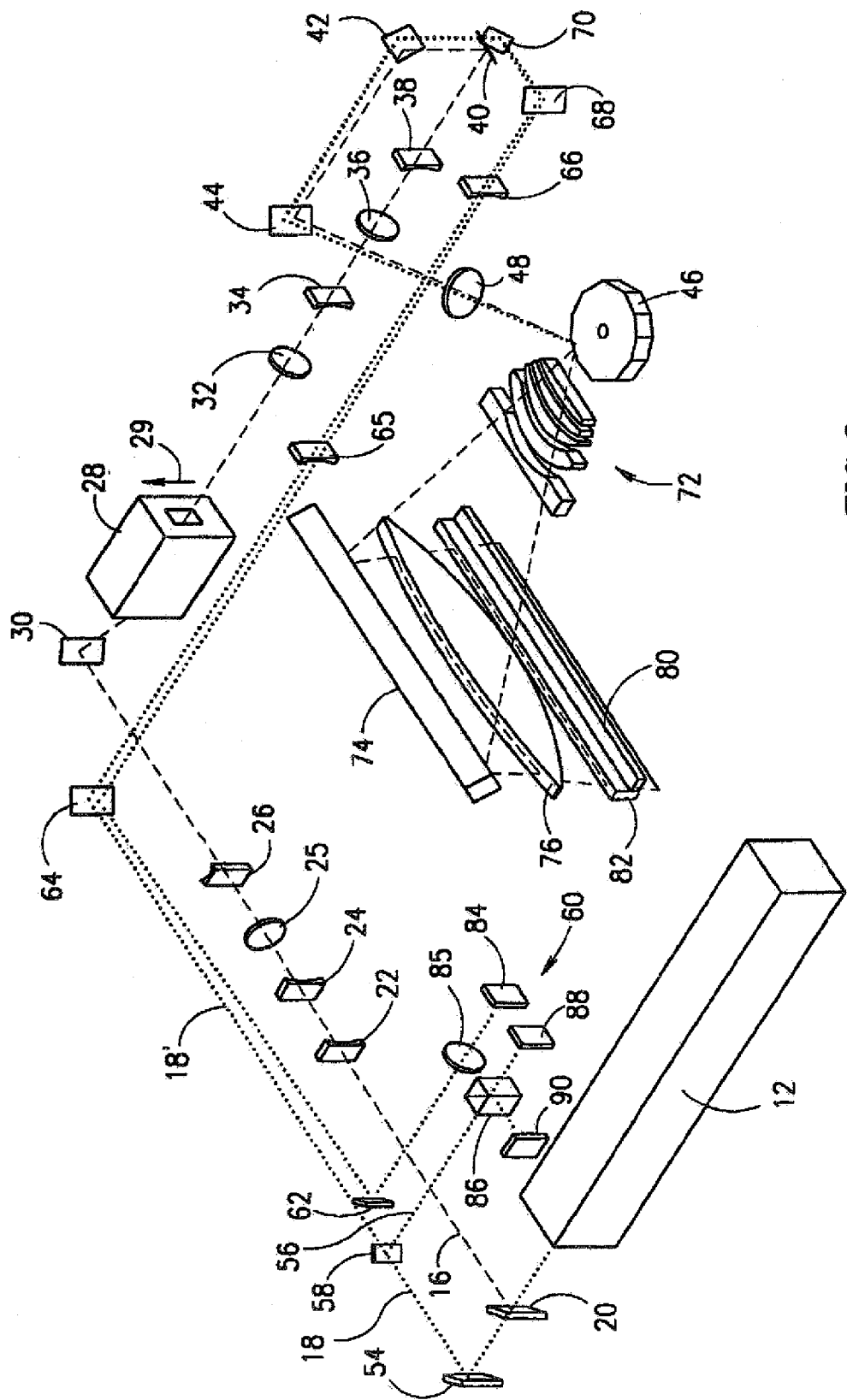
FIG. 3 is a schematic view of the scanner of FIGS. 1 and 2 in which the elements of the scanner are shown without mounts and not to scale, for clarity of presentation.

Reference is made to FIGS. 1-3, which show an exemplary direct writing printed circuit board scanner 10, in accordance with a preferred embodiment of the invention. Scanner 10 comprises a laser source 12, whose output wavelength is suitable for exposing a photoresist coating. In a preferred embodiment of the invention, an Argon Ion type ultraviolet laser, operating at 351.1 and 363.8 nanometers and delivering a maximum power of 4.4 watts has been found suitable. Such lasers are generally available and an Innova Sabre type laser of Coherent, Inc. of California USA or a Beam Lock 2085 type laser of Spectra Physics of California, USA, have both been found suitable. A beam 14 exits source 12 and is split into two beams, a main beam 16 and a test beam 18, by a first beam splitter (or partially reflective mirror) 20. As explained below, main beam 16 (shown as a dashed line), is (eventually) used to scan and expose the photoresist on the printed circuit board. Test beam 18 (shown as a dotted line) is used to determine the scan position of main beam 16 and for certain other test and alignment functions as will be described below. Preferably, splitter 20 and the mirrors and other splitters described below are front surface mirrors and splitters. Preferably, the mirrors and splitters are dielectric front surface mirrors.

Since the power required for testing is much lower than that for writing, beam splitter 20 preferably reflects much more power than it transmits. Preferably of the order of 99% of the power of beam 14 is reflected into main beam 16. In the following explanation, the two directions perpendicular to the propagation axis of the beam are designated as the "scan direction" and the "cross-scan direction". These directions correspond to the direction of scanning of the writing beam and the direction perpendicular to both the beam axis and the scan direction, respectively. It should be understood that the full import of this nomenclature becomes clear below.

For ease of explanation, the optical path of main beam 16 is discussed first. Main beam 16 is passed through a series of optical elements 22, 24, 25 and 26 whose function is to focus the beam on a modulating surface within a modulator 28 after the beam's reflection from a first mirror 30. For the exemplary embodiment of FIGS. 1-3, these elements are a first cross-scan cylindrical lens 22, a second cross-scan cylindrical lens 24, a first spherical lens 25 and a first scan cylindrical lens 26. Moreover, while beam 16 is substantially round after reflection from first splitter 20, it is oblong when it enters modulator 28, being longer in the cross-scan direction than in the scan direction. As the beam passes through modulator 28, segments of the beam in the cross-scan direction are independently modulated by modulator 28. Such a beam may be considered to comprise a plurality of separately modulated beams traveling side by side. However, for ease of visualization only a single beam path is shown for main beam 16. The cross-scan direction is the vertical direction at the exit from modulator 28 (as indicated by reference number 29 on FIG. 3.

Although the main beam is described, in the preferred exemplary embodiment, as being a single beam comprising a plurality of separately modulated sub-beams, it is readily understood that, for some aspects of the invention, beam 16 could be formed of a plurality of discrete beams, produced, for example by beam splitters, a plurality of laser emitters or other suitable means.

It may be noted that, for this exemplary embodiment, first mirror 30 does not reflect main beam at 90°. Rather, beam 16 is reflected from mirror 30 at an acute angle and it impinges on modulator 28 at an angle different from the angle with which it leaves the modulator. Modulator 28 is preferably an acousto-optic modulator as well known in the art and as described in "Design and Fabrication of Acousto-optic Devices," pages 94 ff, edited by Akis P. Goutzoulis and Dennis R. Papa, published by Marcel Dekker, Inc., 1994, which is incorporated herein by reference. After modulation, the beam must be further optically processed, preferably through an anamorphic lens system, to prepare it for scanning. In the exemplary embodiment of FIGS. 1-3, the beam is first passed through a second spherical lens 32, then successively though a third cross-scan cylindrical lens 34, a third spherical lens 36 and a fourth cross-scan cylindrical lens 38. Main beam 16 is then reflected from second third and fourth mirrors 40, 42, and 44. After reflection from mirror 44, beam 16 is aimed at a facet of a rotating polygon 46. The beam preferably passes through a compound lens 48 prior to impinging on polygon 46. As indicated below, the z-position of lens 36 may be adjusted to (for example by movement of a motorized mount, not shown) focus the beam on different thicknesses of PC board. While all the other lenses of the system may be simple fused silica lenses, lens 48 is preferably a compound lens to correct chromatic on-axis errors so that the focal points of the two laser wavelengths (351.1 nm and 363.8 nm) in the scan and cross-scan directions on the board coincide more closely.

It will be noted from FIG. 1 that after passing through lens 38, beam 16 is folded over by reflector sets 50 and 52 (not shown on FIG. 3 for simplicity of visualization). The object of these reflectors is to increase the beam path length and increase the size of the beam, such that the optical power density on the optical surfaces is decreased.

It will be further noted that, for the exemplary embodiment, the focusing in the cross-scan direction is much greater than that in the scan direction. In a preferred embodiment of the invention, beam 16 is focused in the cross-scan direction on the facet which reduces errors caused by polygon wobble and is defocused (collimated) in the scan direction such that the facet is well underfilled, so as not to lose power.

Turning to the path of test beam 18. After passing through first beam splitter 20, test beam 18 is reflected by a fifth mirror 54 such that its path is preferably substantially parallel to that of main beam 16. A beam rotator 55 preferably rotates beam 18 by 90° about its axis for reasons that will be understood later. Other than the rotation, the rotator, which may be a series of mirrors, preferably does not change the axis of beam 16.

A portion 56 of beam 18 is split off the test beam by a second splitter 58 and directed toward laser alignment apparatus 60, whose operation is described below. In a preferred embodiment of the invention, splitter 58 is a 50-50 splitter, although substantially different ratios may be used. Beam 18 passes to the side of a sixth mirror 62 and impinges on a seventh mirror 64 which reflects it so that it is preferably substantially parallel to beam 16, after that beam leaves modulator 28. It will be noted that beams 16 and 18 are relatively far apart on this leg of their path. Beam 18 is subjected to focusing in the cross-scan direction by Two cylindrical lenses 65 and 66. A mirror pair 68, 70 reflect beam 18 so that it too is reflected by mirrors 42 and 44 toward polygon 46 via lens 48. However, beams 16 and 18 are no longer parallel when they reach mirror 42. Mirror 70 is preferably placed at an angle such that beams 16 and 18 are traveling at an angle, towards each other. Preferably, the angle is such that the beams are substantially coincident at the facet of polygon. After reflection from the facet, they diverge.

It will be noted that beams 16 and 18 preferably lay in a vertical (cross-scan) plane as they leave mirror 42. This assures that they will scan at substantially the same scan position after reflection from the polygon facet. Beam 18 is thus, for example, above beam 16 prior to impingement on polygon 46 and below beam 16 after reflection from polygon 46.

Unlike main beam 16, which underfills a single facet, test beam 18 is preferably focused at the facet, in the cross-scan direction and overfills more than two facets in the scan direction. When the polygon rotates, main beam 16 is traced on the facet as described below. At the same time, the facet cuts part of beam 18 out of the total beam. As test beam 18 is Gaussian, the total power of this cut part changes with scan angle.

Scanning optics 72 focuses both beams as they are scanned across optics 72 by polygon 46. In general, optics 72 is spherical optics such that it substantially focuses both beams in the scan and cross-scan directions. The beams are reflected by a scanning mirror 74 toward a lens 76. Beam 16 impinges a photoresist coated printed circuit board 78 after passing through a cylindrical (cross-scan) lens 82. Lens system 72 together with lens 76 forms a quasi-f-θ optic system that converts the angular variation imparted to the beam by the polygon to linear movement across the board.

Beam 18, which has meanwhile diverged from beam 16, impinges on a scale 80 without passing through cylindrical lens 82. It should be noted that the scan position of beams 16 and 18 are substantially identical such that a measurement of the scan position of test beam 18 defines the position of beam 16.

Scale 80 is preferably oriented at a slight angle (about the scan direction axis) from the normal of the direction of beam 18. In this way, while beam 18 is reflected from the scale in almost the same direction as it arrived at the scale, a slight angle is introduced between the incoming and reflected beams. For clarity of exposition, the reflected beam is denoted as beam 18' in the description and in the drawings, where feasible.

Beam 18' passes through lens 76, mirror 74, optics 72, polygon 46, lens 48, mirrors 44, 42, 70 and 68 and through lenses 66 and 65 to mirror 64. By the time the beam reaches mirror 62, beams 18 and 18' are separated such that mirror 62 intercepts beam 18' and reflects it, through a lens 85, to a detector 84. Detector 84 detects modulation imposed on the beam by markings on scale 80. These detected signals, which contain information on the position of scanning beam 16, are preferably used to control the modulation of beam 16 by modulator 28, as described below.

Returning now to beam 56 that is derived from test beam 18 by splitter 52. Beam 56 impinges on a beam splitter 86, preferably after passing through a first spherical lens (not shown). One portion of the beam is sent, preferably after passing through a second spherical lens (not shown) to a first quadrapole detector 88. The first and second spherical lenses project the waist of the laser beam onto detector 88, such that signals from detector 88 indicate deviations of the beam in scan and cross-scan dimensions.

A second portion of beam 56 is sent by beam splitter 52 to a second quadrapole detector 90, via a pair of lenses (not shown, for clarity). The pair of lenses is configured to operate as an f-θ lens, such that signals from detector 90 show angular deviations in both the scan and cross-scan directions. Preferably, circuitry 91 receives the signals and passes them to a system controller.

When the system is originally aligned, the detectors are positioned and adjusted such that their deviation signals are all zero. When the laser is replaced, the entire system need not be realigned. It is sufficient to place the laser in its mount and to adjust its height and angular positions such that both detectors 88 and 90 produce a zero deviation signal. Such a zero deviation signal will be produced only when the laser is appropriately aligned to produce a beam having precisely the same beam path as the laser with which the system was originally aligned. The result of aligning the laser is that the entire system is aligned.

Preferably, the system is mounted on a synthetic granite base 92, for stability. Many of the components are preferably mounted on rails 94, utilizing mounting methods as described in a co-pending PCT patent application entitled "Optical Alignment and Mounting System," the disclosure of which is incorporated herein by reference, filed on even date as the present application, in the European Patent Office as PCT receiving office. This mounting scheme allows for the easy replacement of components without realignment of the entire optics, or even of the replaced component.

Beam Modulation

As indicated above, main beam 16 is piecewise modulated by modulator 28. In general, the present invention contemplates writing of very small elements with very high accuracy. In general, features (such as lines) having an extent of less than about 50 micrometers (2 mil) are to be written.

To this end, the beam is modulated at modulator 28 such that, when the modulated beams are projected onto the printed circuit board, they form spots having a center to center spacing of one-eighth of the minimum feature size to be written. However, it should be noted that, while the center to center spacing is about 6.35 micrometers (0.25 mil), the spot size of the individually addressed scan lines, due to diffraction and other optical effects, is generally poorer, namely about 19 micrometers (0.75 mil). It should be noted that the beam is addressable at the scan line resolution of every 6.35 micrometers (on the board). The result of these dimensions allows for the achievement of high fidelity patterns of 2 mil feature size with sharp edges and exact line-width control. In practice, in a preferred embodiment of the invention, scan line positions on the board corresponding to the addressable modulated beam segments are preferably scanned a plurality of times.

FIGS. 4A-4D show four scanning schemes in accordance with preferred embodiments of the invention. In each of these Figs., cross-scan is from left to right. Note that only a single line in the scan direction is shown. The upper line represents the scan line number (on the printed circuit board) and the scan line data being written. The scan lines for which exposure is desired are shown shaded, and those for which no data is to be written are shown without shading. In the example shown scan lines 7-10, 19-26 and 31-34 are to be exposed and the other lines are not.

The lower lines represent successive scans and the numbers represent the modulated beam segments (the corresponding modulator channel number for each scan). The beam extends over 24 modulator (=scan line) channels. In each case, a channel will have the data corresponding to the index in the upper line written in it. For ease of visualization, the channels which transmit the beam to expose the PC board, are shown shaded, while those that are not are shown white.

Figures 4A, 4B:
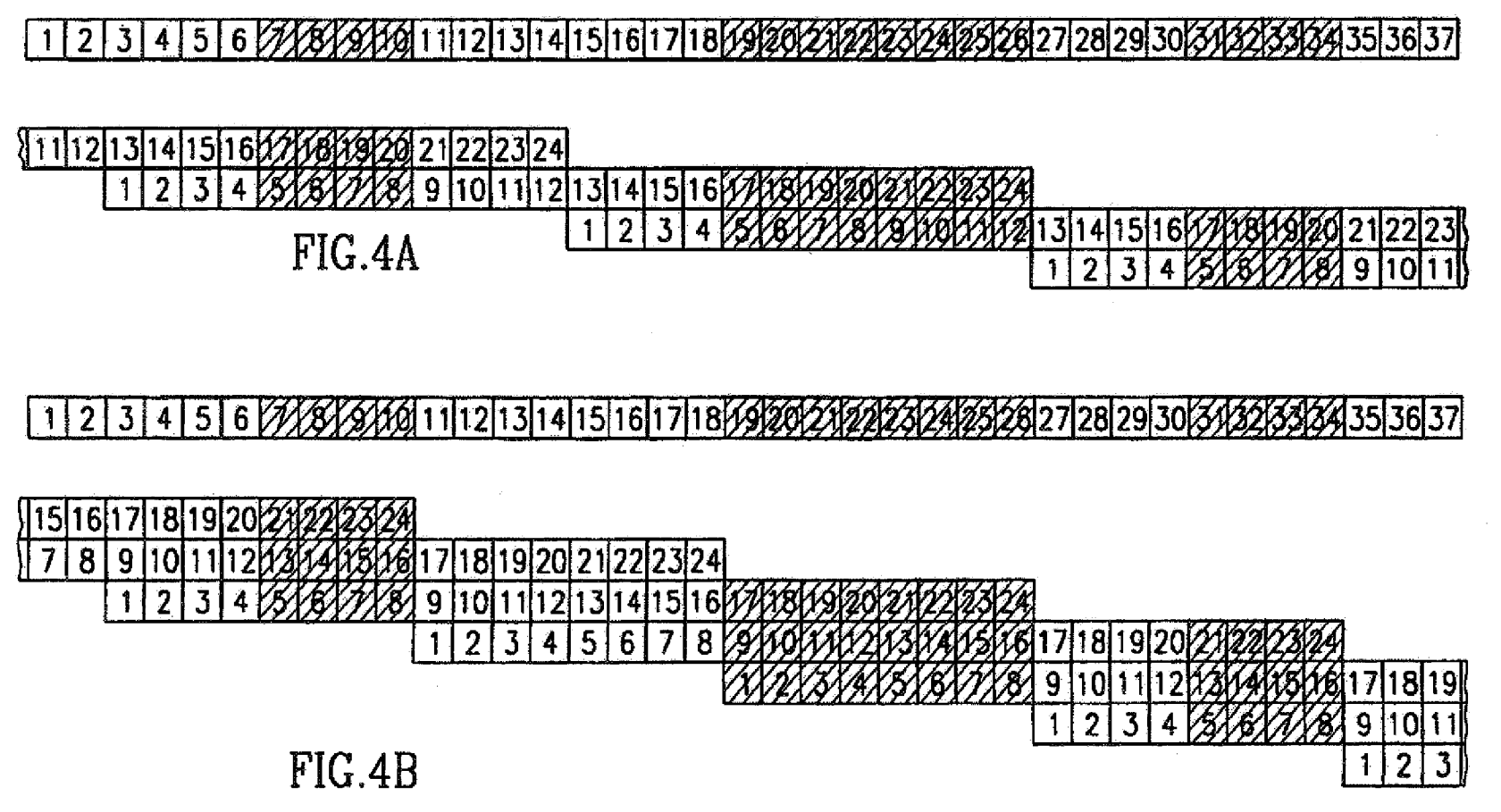

FIG. 4A shows a first exemplary scheme, referred to herein as a 2× overlap, since each scan line is written twice. FIG. 4A shows three swaths of the scan. In this particular scheme, when the swath of the scan lines is 24 scan lines wide, for 2× overlap, the swath advances 12 scan lines for each scan. For the first scan (only a portion is shown) modulators 17-20 pass the beam for writing. For the second scan at the same scan position, shown in the next line, modulators 5-8 and 17-24 pass the beam for writing. For the third scan at the same scan position, shown in the next line, modulators 5-12 and 17-20 pass the beam for writing. For the fourth scan at the same scan position, shown in the next line, modulators 5-8 pass the beam for scanning. In the referred exemplary embodiment, it is noted that the lines in the beam are not interlaced when the swathes overlap.

Figure 4C:
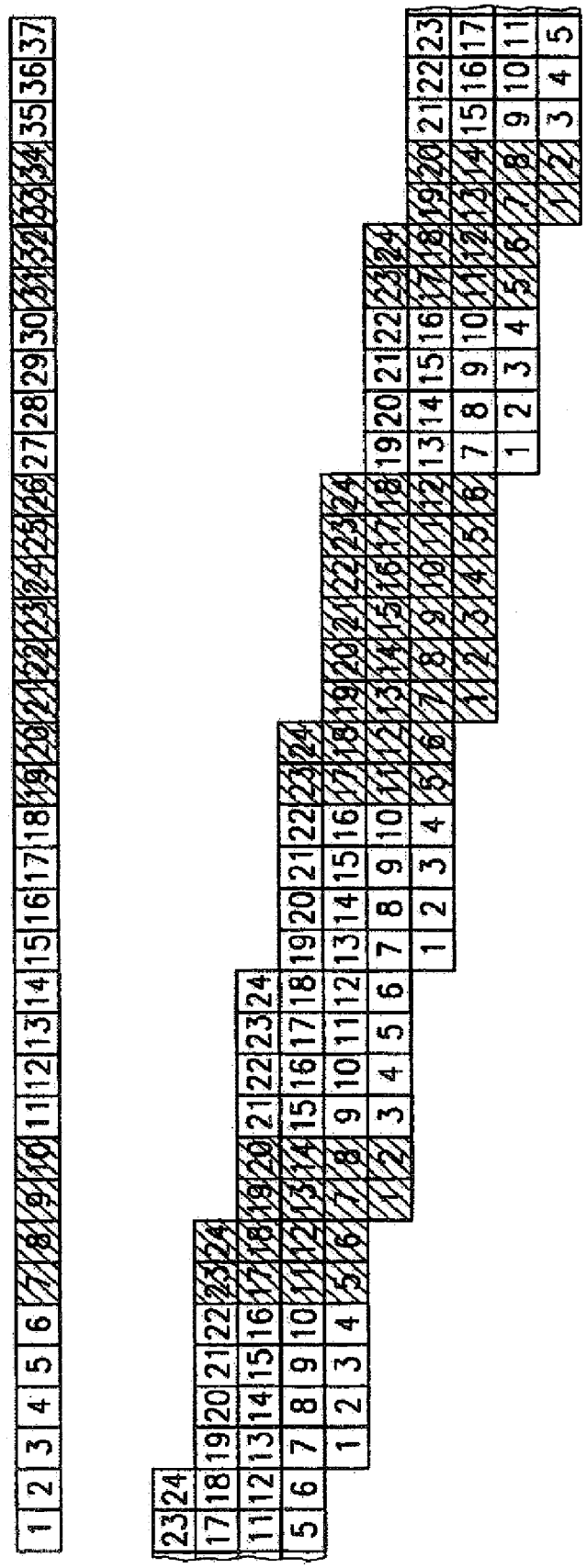
Figure 4D:
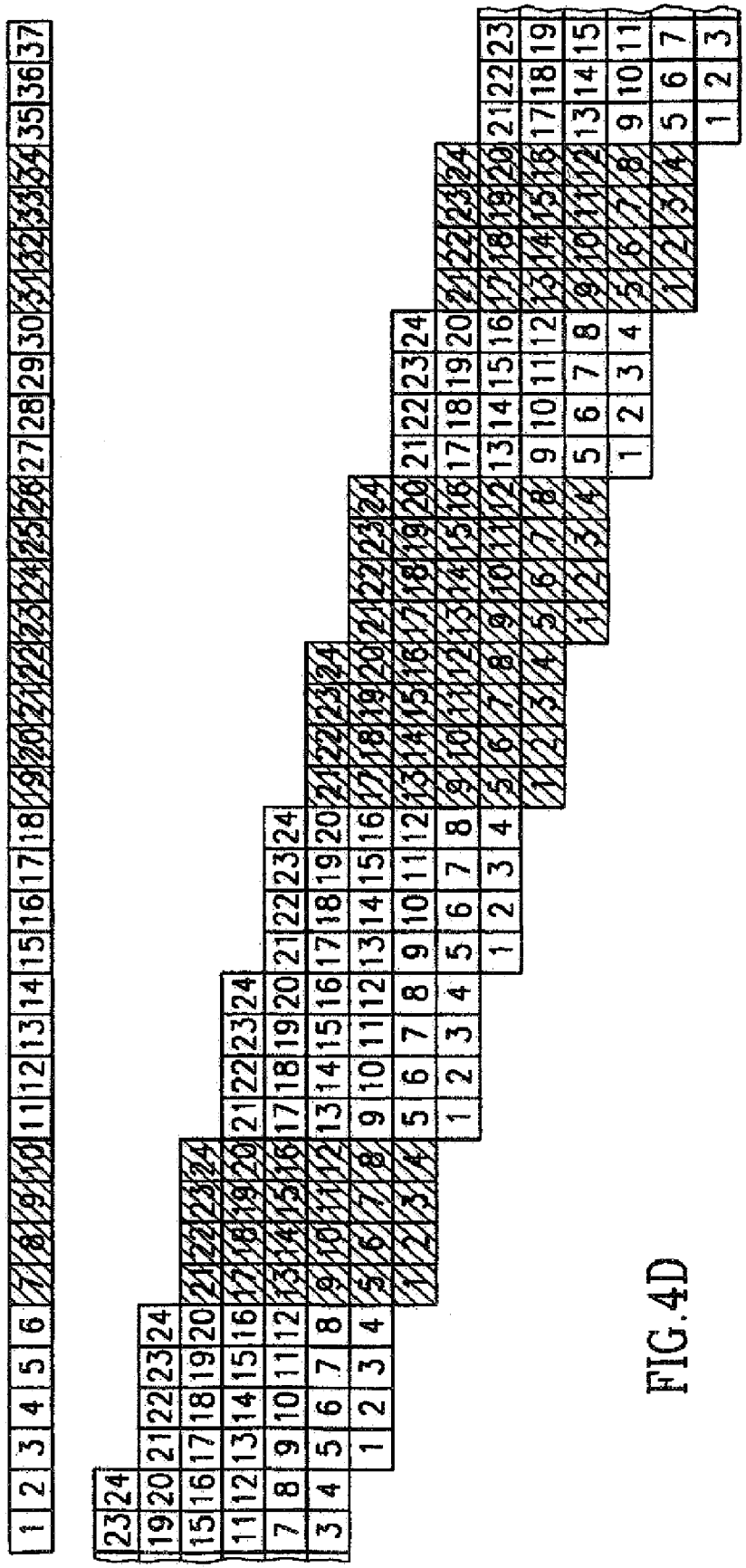

FIGS. 4B-4D show 3× overlap (where the swath advances 8 scan lines for each scan), 4× overlap (where the swath advances 6 lines for each scan) and 6× overlap (where the swath advances 4 lines for each scan), respectively. It should be understood that 12× overlap and 24× overlap are also possible.

It should be understood that only one line of data along the cross-scan direction is shown. This represents data for a single scan position of the swath. As the swath advances, the data is changed such that the modulation is in accordance with the requirements of the pixels being scanned at the particular scan position.

Figure 5:
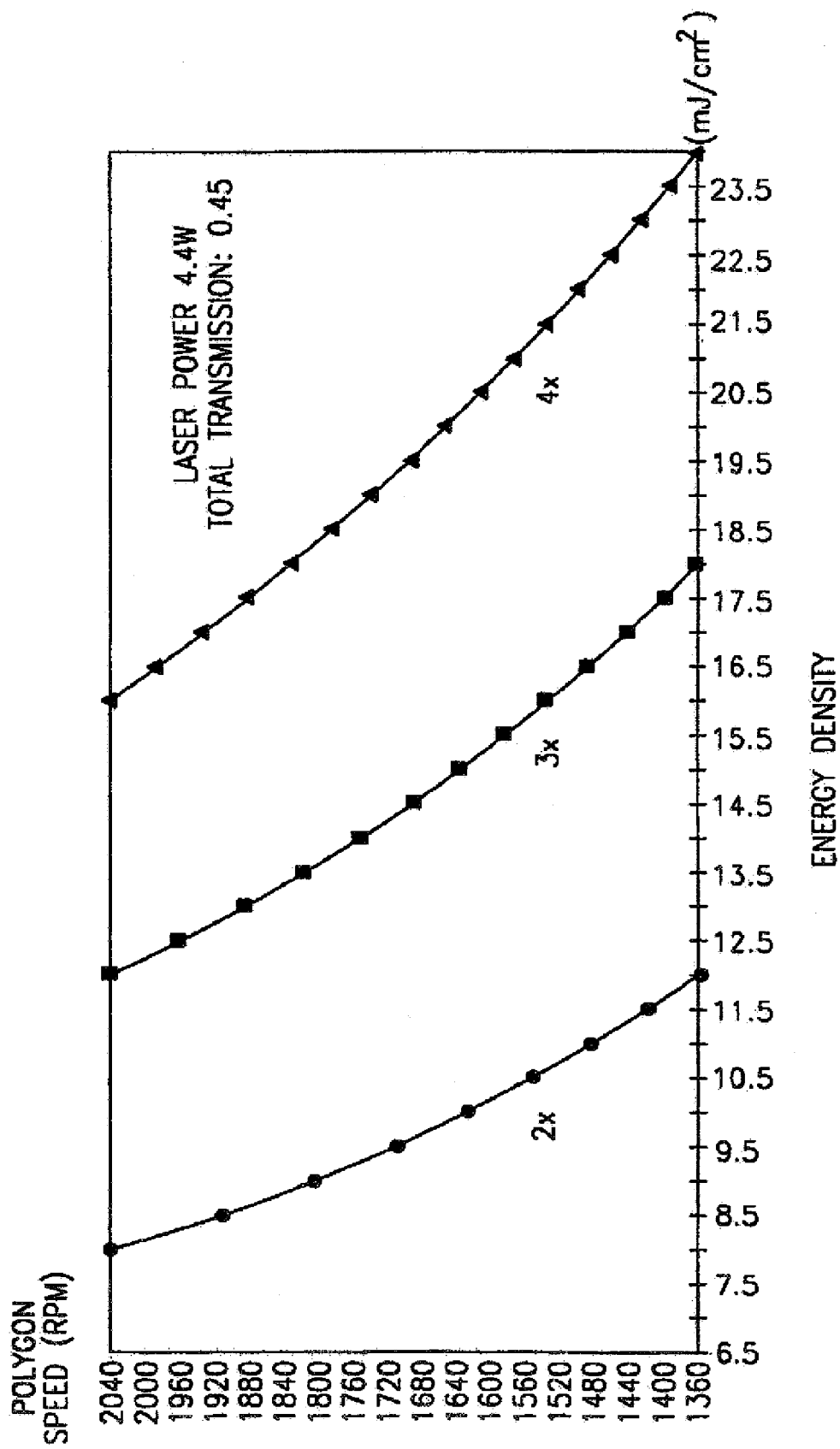
FIG. 5 is an exemplary curve relating scan overlap to polygon speed, for various values of overlap, illustrating a method for optimizing throughput of a direct laser scanner, in accordance with a preferred embodiment of the invention.

In a preferred embodiment of the invention a combination of scan-overlap and polygon speed are used to provide optimum exposure for the photoresist at maximum available writing speed and to maximize the utilization of energy provided by the beam. In this preferred embodiment of the invention, the scan overlap and polygon speed are varied (for different sensitivities of photoresist) to provide a desired exposure energy of the photoresist. Preferably, the laser power is set at a fixed, preferably an optimum (maximum or near maximum) power level. FIG. 5 shows a series of curves relating polygon speed and exposure energy for various scan overlap levels as a parameter for the curves. The curves are based on a scanning length of 24". For very high-speed photoresist, it may be necessary to reduce the power of the laser. However, over a large range of photoresist speeds, as shown in FIG. 5, throughput may be optimized, by adjusting polygon speed and swath overlap while keeping the laser power at the desired optimal level.

It will be noted that just using 2×, 3× and 4× overlap schemes allows for 3× variation of delivered energy for only a 3:2 ratio of polygon speeds. Since the power is kept at a constant optimum (maximum or near maximum) power level, each of these exposures is performed at the maximum speed at which the scanner is capable. Furthermore, by utilizing 6×, 8×, 12× and 24× overlap, the range of exposure energy variations can be much larger, while the power of the laser (and the exposure duration) are optimized.

Figures 6A, 6B, 6C:
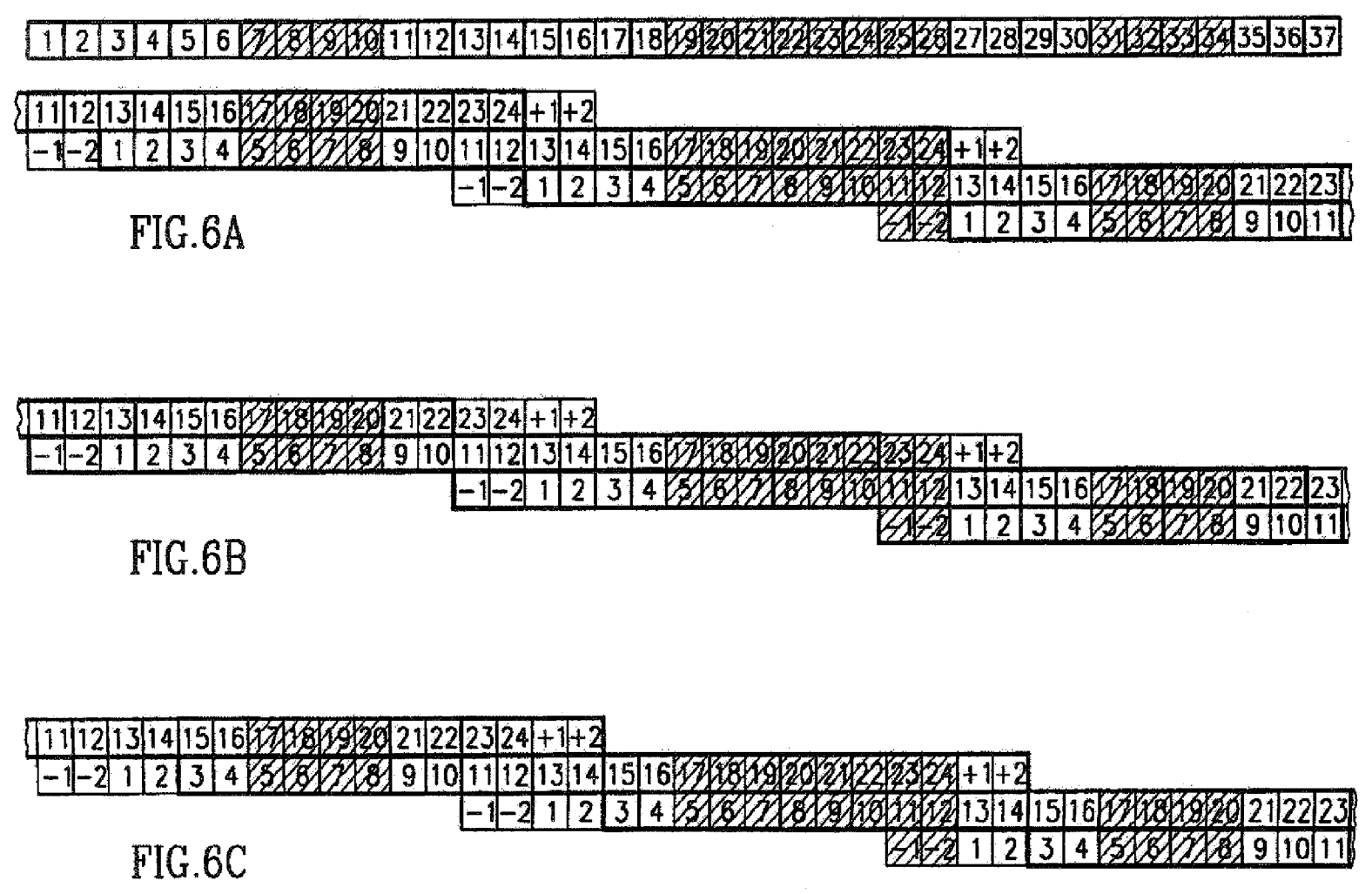

In a further preferred embodiment of the invention, automatic compensation is provided for cross-scan off-set of the laser beam at the modulator. FIGS. 6A-6C illustrate one methodology of providing such automatic compensation. In particular, while the beam illuminating the modulator is 24 physical (scan line) pixels wide, the modulator provides several extra physical channels of modulation on each side of a central 24 pixel portion. In FIGS. 6A-6C, the channels are shaded in the same way as they are in FIGS. 4A-4D and represent modulator settings for the lower lines.

FIGS. 6A-6C show the channels numbered as 1-24 with four extra channels −1, −2 and +1+2 at either end of the modulator. Note that each channel provides modulation in accordance with the line that would be scanned if power were present in the beam at the modulator, namely, the x-axis scan line position.

In FIG. 6A, the beam, shown by a bold outline, is correctly placed. Thus, for the 2× overlap shown, the result is the same as that in FIG. 4A. In FIG. 6B, the beam is mispositioned on the modulator by two scan lines to the left. Note that scan positions 25 and 26, which were written in FIG. 6A, by modulator positions 23 and 24 in the first swath and modulator positions 11 and 12 in the second swath are now written by positions 11 and 12 in the second swath and by −1 and −2 in the third swath. It will be noted, that while each swath may be mispositioned, each line is scanned the proper number of times and with the proper data. FIG. 6C shows the beam mispositioned by two scan lines to the right. Again, the scan power and data are conserved. Thus, by providing more channels of modulation than are necessary for the actual swath width, the cross-scan positioning of the beam in the modulator (and its long term stability) are made less critical.

It should be noted that, in a preferred embodiment of the invention, the energy profile of main beam 16 is not uniform in either the scan or cross-scan directions. In both directions it has a Gaussian or near Gaussian shape. Allowing the beam to have the Gaussian shape in the cross-scan direction increases the overall efficiency of the system, since only the extreme tails of the beam (below $1/e^2$ of the peak power) are not used (or at least are not taken into consideration). If each pixel would be written by a single scan line, this would result in varying exposures for different pixels. However, since each scan line on the PC board is written at least two (and usually more) times utilizing different portions of the cross-scan beam swath, the total amount of power delivered to the photoresist is fairly constant even though most of the Gaussian cross-section of the beam is used. Furthermore, since each of the individually modulated scan lines is about three times smaller than the diffraction limit, as described earlier, there is a further homogenizing of the power to written lines.

The Main Beam Optical System

In accordance with preferred embodiments of the invention, an improved optical system is provided. This optical system can be subdivided into two parts, in accordance with their different functional tasks: the Modulator Illumination System, and the Modulator to Printed Circuit Board Imaging System. The system can also be subdivided into pre-scanning optics and scanning optics. The pre-scanning optics comprises all lenses, situated between the laser and the polygon. The scanning optics comprises the optics between the polygon and the board plane. This division is desirable because of the very different requirements for these two parts. The elements of the pre-scanning optics are small in size, since the beam is small. However, the power density is high which may cause problems.

For the scanning optics the requirements with respect to beam size and power density are generally reversed.

The Modulator Illumination System transforms the beam from the laser head to the modulator in accordance with the optical requirements of the laser waist transformation, which is well known in state-of-the-art laser optics. As a result, the modulator channels are illuminated, preferably with a Gaussian energy distribution having different extents in the scan- and cross-scan directions. The beam is preferably collimated by this optics so that the laser waist is at or near the modulator.

In a preferred embodiment of the invention an improved laser illumination system is provided. FIGS. 7A and 7B show the portion of the main beam optics, up to modulator 28. These elements are shown above in FIGS. 1-3 however, FIGS. 7A and 7B show adjustments that can be made to these elements, as required. FIG. 7A shows a view of the system from above. In this view, the scan direction is from top to bottom. FIG. 7B shows the beam viewed from the side, with the cross-scan direction from top to bottom.

The portion of the optical system shown in FIGS. 7A and 7B consists of four lenses (22, 24, 25 and 26) with different and combined optical power in scan and cross-scan direction. In a preferred embodiment of the invention, lenses 22 and 24 are identical cylindrical lenses with an optical power in the cross-scan direction, lens 25 is a spherical lens and lens 26 is a cylindrical lens with an optical power in the scan direction.

Lenses 25 and 26 are effective as a dynamic beam expander in the scan direction. By moving lens 26 along the optical axis, the size of the beam at the modulator, in the scan direction, can be increased or decreased. This feature is effective to compensate for individual differences and changes during the lifetime of the laser source, such as its waist diameter, waist position and beam mode purity ($M^2$). It allows for a compromise between the requirements for high diffraction efficiency of the modulator (i.e. transmission of the beam by the modulator) which requires a larger scan direction beam size and the requirements for application of the "scophony effect" which requires a smaller scan direction beam size. The scophony effect is used to decrease or remove blur of generated edges in the scan direction of flying spot scanners. It is explained below and in the above referenced "Design and Fabrication of Acousto-Optic Devices", on pages 190-192, and in U.S. Pat. No. 4,205,348, the disclosures of both of which are incorporated herein by reference.

Lenses 22, 24 and 25 act as a combined beam expander vario and beam steering system for the cross-scan direction. By moving lens 22 along the optical axis, the size of the beam at the modulator is changed but it is de-collimated. By moving lens 24 in the opposite direction, the beam, is re-collimated.

By moving the lenses 22 and 24 in the cross-scan direction, out of axis, the beam can be steered with respect to local placement and angle of the optical axis at the modulator. In a preferred embodiment of the invention, beam angle and location are measured using light guide 152 described below. For clarity, a preferred methodology of performing these measurements is described in a section below, titled "Determination of Cross-Scan Errors". If "p" and "a" are measurements of local and angular shifts of the beam, the steering information is: $\Delta y = c*p + d*a$ for lens 22 and $\Delta y = e*p + f*a$ for lens 24, where c, d, e and f are constants dependent on the optical design. Correction of this type is especially important if the modulator only has the same number of segments as are required for writing. If a modulator with extra channels, as described in conjunction with FIG. 6 is used, the beam positioning requirement is less exact.

Such a beam expander vario and beam steering system is needed to compensate for variations caused by thermal changes or changes in laser resonator conditions of an electrical or optical nature during daily usage cycles or during the lifetime of the laser. If these variations are not corrected, the generated pattern deteriorates. Inappropriate size or local placement of the beam at the modulator leads to uneven power distribution due to the 2×-24× overlapping procedures as described above and, consequently, to increased line-width variation or edge roughness of the generated pattern. Inappropriate angular variation lead to power losses due to cutting parts of the beam at a Numerical Aperture Stop of the exposure system or to unsymmetrical effects at the edges of the generated pattern.

In the preferred embodiment as described above all these deteriorating effects for the generated pattern are preferably prevented.

The Modulator-Printed Circuit Board Imaging System is responsible for transmission of an image of the modulator to the printed board plane.

In a preferred embodiment of the invention, the focus of the laser beam on the PC board is optically adjustable. Of course, focusable optical systems are known. However, complicated scanners such as those of the present invention are generally of fixed focus. This is not surprising considering the manifold requirements on the system and the (generally) different focusing schemes for the scan and cross-scan directions. It is also noted that the object must be moved only a relatively short distance to bring it into focus. However, the present inventors believe that for high accuracy, the mechanics should be as simple and robust as possible.

In order to allow for such focusing, the system requirements such as high total laser power transfer efficiency, high resolution and high fidelity pattern generation must be taken into consideration.

FIGS. 8A and 8B shows a functional schematic of the preferred embodiment of the invention. As with FIGS. 7A and 7B, FIGS. 8A and 8B represent views along the cross-scan and scan directions respectively.

The modulator-board imaging system consists of several modular units. The starting point of the imaging system is acousto-optical modulator 28, which preferably is a multi-channel modulator. The center position of the acoustic wave on the optical axis is regarded as the object plane. Type AOMC 117/24-UV acoustic modulator from Crystal Technology, Inc. is an available 24 channel modulator, suitable for some preferred embodiments of the invention.

In the scan direction (FIG. 8A), a first modular imaging unit consists of spherical lenses 32 and 36, which forms a first image of the modulator plane(object plane) at a plane 39. A second modular imaging unit images the image at plane 39 to the plane of the PC board 78. The second modular unit comprises spherical lens 48 and the spherical part of the scanning lens system 72 and lens 76. Consequently, between polygon 46 and board plane 78, the optical system works as a quasi f-θ lens which is preferably telecentric. A physical stop 31 is shown between lenses 34 and 36. This stop made large enough so that it does not limit the scanning numerical aperture in this direction which is defined by the rotating facets of the polygon. Its main function is to stop the directly transmitted beam from modulator 28 from entering the optical system. A physical stop 31' in the cross-scan direction does define a numerical aperture in this direction.

To achieve steep side walls of the generated pattern and high power efficiency, the scophony effect and facet tracking as known in the art are preferably used. A requirement for the scophony effect is that the acoustic velocity of the switching information in the modulator medium—reduced by the reduction ratio of the optical system between modulator and board—is equal to the scan speed of the writing spot on the board, but in the opposite direction. This leads to "standing" data information on the predetermined place on the board. As the acoustic velocity for quartz material which is used as an optical medium in the modulator is 5.7 km per sec and the scanning speed is 0.270 km per sec (≈1700 RPM polygon speed—see FIG. 5) a reduction ratio of about 21× is required. If this reduction ratio is fixed, each difference of the scan speed from 0.270 km per sec (as required to achieve optimum scan times) leads to blur at the pattern edges. The magnitude of the blur at different scan speeds can be reduced by reducing the size of the illumination beam at the modulator. But reduced size results in increased divergence and, consequently in reduced diffraction efficiency of the modulator.

The beam size to $1/e^2$ at the polygon is smaller than the facet width. The facet itself acts as a Numerical Aperture stop for the scan direction and, as the rotation of the polygon deflects the beam, the aperture moves. If the beam to the polygon were fixed in position, the movement of the polygon would result in a reduced power over the scan. This can be compensated for by changing the carrier frequency of the modulation signal at the modulator, to cause an angular change of the optical axis at the modulator, leading to a parallel shift of the beam at the polygon. The modulation frequency is changed such that the beam is traced synchronously with the rotation of the facet (facet tracking).

Facet tracking improves the cycle time efficiency compared with other methods (see Goutzoulis et al., page 182 ff.) to about 99%. As it is known in the art, maximum diffraction efficiency (transmission) at the modulator is reached, if the incident ray and the acoustic wave front form a special angle—the Bragg Angle. As the Bragg Angle only depends on wavelength of the beam, acoustic velocity in the optical medium and carrier frequency of the modulation signal, the beam adjustment can only be optimized for one frequency. This is generally chosen as the center frequency of the sweep. For the outer positions of the sweep, the diffraction efficiency decreases, reducing the power delivered to the board, in those positions. A preferred embodiment of the invention compensates for this effect optically and consequently, equalizes the power distribution along the scan. This is accomplished by focusing the beam in the cross scan direction on the polygon and also on the board. Thus, small angular cross-scan changes in the beam direction caused by wobble do not result in movement of the beam position on the board.

Turning to FIG. 8B, in the cross-scan direction spherical lenses 32 and 36 and the cylindrical lens 34 are a modular imaging unit with a real focus close to that for the scan direction, with cylindrical lens 38 removed. With lens 38 in the system, the cross-scan focus at plane 39 turns to a virtual focus. Together with spherical compound lens 48 a real second image is formed at or near the polygon facet only for cross-scan direction. The image size in cross-scan is many times smaller than the facet height. A third modular imaging unit from the second image to the board plane consists of the spherical part of the scanning lenses (72 and 76) and cylindrical lens 82.

This third modular unit is responsible for the polygon wobble compensation, because angular variations of the facets, which are near the second focus are transmitted to the board plane as angular variations as well, not as local position variations. However, imperfections in the optics do cause systematic deviations in the cross-scan position of the beam as it scans along its scan path. These deviations can be compensated as described below. The reduction ratio of the entire cross-scan imaging system from the modulator to the board is predetermined by the required data resolution. In the preferred embodiment of the invention, the width of a single modulator channel of 375 micrometer as the smallest addressable unit is reduced to 6.35 micrometer in accordance with a required address resolution of 4000 DPI (dots per inch). As a result a reduction ratio of 59× is chosen for the cross-scan direction.

In a preferred embodiment of the invention, both the scan and cross-scan directions have practically a joint image plane (first image of modulator plane) intermediate between modulator and printed circuit board. It should be noted, that the image planes can differ by a small amount. Preferably, both beam directions were brought to focus by a single element, which is lens 36. The reduction ratio from this point to the board plane is equal for both directions. In this manner, simple axial movement of lens 36 allows for a nearly equal change of focus for both the scan and cross-scan directions. The gear ratio between the focusing lens 36 to the focus shift at the board is decided by the reduction ratio from first focus 39 to board plane 78.

In an exemplary system, according to a preferred embodiment of the invention, the following reduction ratios are chosen:

Scan direction: Modulator-to-first image: 12.35×; first image-to-board: 1.7×; and modulator-to-board: 21×.

Cross-scan direction: Modulator-to-first image: 34.7×; First image-to-second image: 0.113×; second image-to-board: 15×; first image-to-board: 1.7×; and modulator-to-board: 59×

As indicated above, in order to improve the accuracy and edge resolution of the beam in the scan direction, facet tracking and scophony are used in modulator 28. However, this causes the beam deflection angle in the modulator to vary. In turn, this causes the power in the beam to vary, since the modulator efficiency is a function of the deflection angle. This results in the power being non-uniform across the scan. To correct for this phenomena, the f-θ lens is a lens in which $x=f(\theta)$, where $f(\theta)$ is a compensating function which slows down the beam where the power is low, namely at the ends of the scan. Generally, a simple quadratic correction, $x=f_1*\theta+f_2*\theta^3$ is sufficient to effectively compensate for the power non-uniformity, where $f_1$ is the center focal length and $f_2$ preferably is a negative number.

Acousto-Optic Modulator for Multiple Wavelengths

Figure 18A:
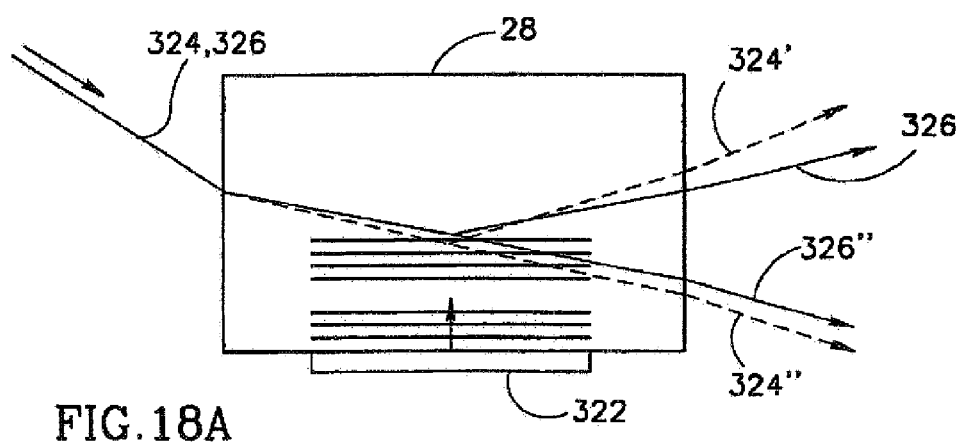
FIGS. 18A and 18B show a prior art acousto-optic modulator and an acousto-optic modulator constructed in accordance with a preferred embodiment of the invention.

FIG. 18A shows an available modulator 28, such as the above referenced commercially available modulator. In modulator 320, acoustic waves are generated at a transducer 322 and form the pattern which is used to diffract input beams 324 and 326. As indicated above, the present invention contemplates using a laser with two spectral lines. For efficiency, both lines should be used. However, as shown in FIG. 18A this would result in diffracted beams 324' and 326' at the two wavelengths having different exit angles, since they are refracted differently as they enter and leave the modulator and since their Bragg angles are different.

Figure 18B:
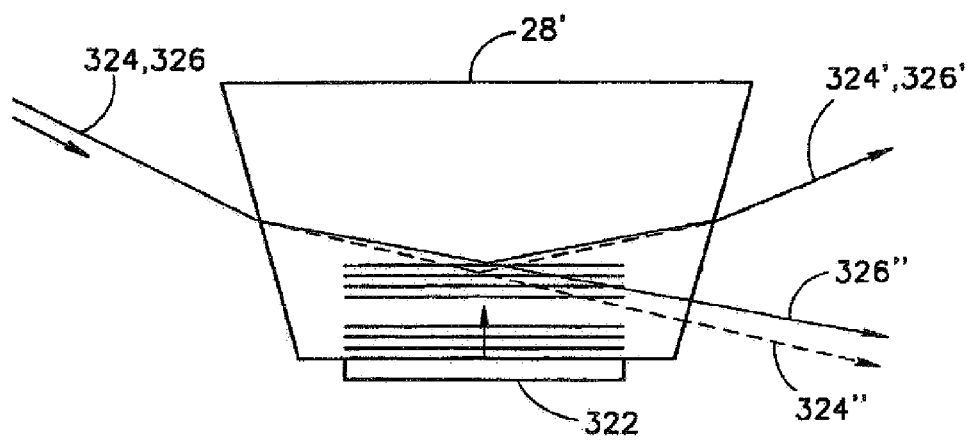

FIG. 18B shows a proposed solution to this splitting of the lines when they leave the modulator. In modulator 28' of FIG. 18B, the modulator entrance and exit faces are not parallel. Rather they are at an angle which is designed such that the difference in refraction for the two beams (at the different wavelengths) at the input and output faces is exactly equal and opposite to the difference in Bragg angles for the beams. Thus, the two beams which enter together, exit together.

It is noted that transmitted beams 324" and 326" have different exit angles. However, since only the diffracted waves are used in the present system, this is not of interest. However, for systems which use the transmitted beams rather than the diffracted ones, a complementary angle between the input and output faces will result in the beams leaving at the same angle for transmission. Of course, this will increase the deviation for the diffracted beams.

Scan Direction Position Measurement

One of the most critical elements in accurate direct laser writing of PC boards is knowledge of the position of the beam on the PC board. This knowledge allows for the proper modulation of the beams (or more precisely, the scan lines) with correct data, at the position of the scan lines. The PC board moves in the cross-scan direction and the beam scans in the scan direction. Thus, the position of the beam may be completely determined from knowledge of the cross-scan position of a table 79 on which PC board 78 is mounted and of the scan position of the beam.

It is straightforward to determine the cross-scan position of the table. Any of the well-known encoders known in the art may be used. In a preferred embodiment of the invention, the table is transported along two x-shaped rails 96 and an optical encoder is used for the measurement. A scale 98, associated with the encoder is shown in FIG. 1. In a preferred embodiment of the invention, a type LIE 5 by encoder system Numerik Jena GmbH, Jena, Germany; (accuracy 2 μm, resolution 0.2 μm) is used. Preferably, the cross-scan position measurement is made to an accuracy of ±2 or 3 micrometers and a resolution of ±0.1 micrometers, although other resolutions and accuracies may be used, depending on the system requirements.

It should be noted that each feature on the printed circuit board is written by several segments of beam 16. Thus, knowledge of the cross-scan position can be used to determine modulation of the beam to a positional accuracy greater than the minimum required feature size. The data position may be adjusted to a positional accuracy equal to the scan line spacing, which is generally much smaller than the required accuracy.

It is more difficult to determine the scan direction position of the beam with great accuracy. This problem is made somewhat more difficult by the use of a scan speed that varies with position, since this requires more precise control over the data stream from the data source.

Figure 9:
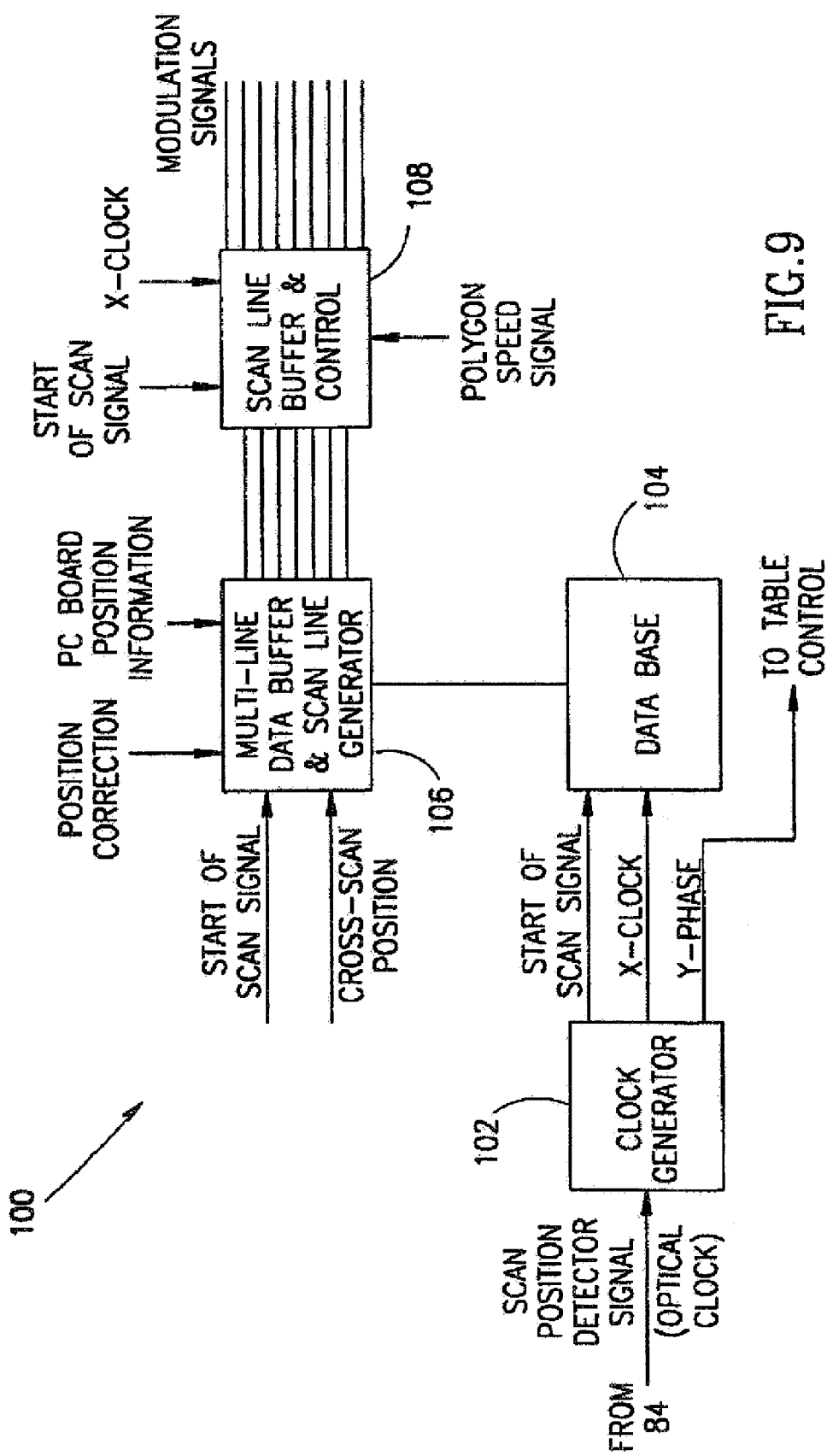
FIG. 9 is a simplified block diagram for a data control system for a scanner in accordance with a preferred embodiment of the invention.

FIG. 9 is a simplified block diagram for a data control system 100, for a scanner in accordance with a preferred embodiment of the invention.

Control system 100 receives signals from detector circuitry 84. These signals represent the variations in power of beam 18' as modulated by the markings on scale 80. In general, these markings produce an analog signal (the "optical clock") with a relatively low pulse rate, much lower than the data clock rate for the system. A clock generator 102 generates an X-clock (data clock) and a start of scan signal from the scan position detector signal. A preferred method of generating the x-clock from the scan signal is described below. The following features of the clock should be noted however:

1) The average x-clock rate is preferably not constant over the length of the scan.
2) Data is sent to modulator 28 based on the instantaneous x-clock count and the start of scan signal. It should be understood that while the data is sent to the modulator in response to the x-clock, there is no data sent except at times for which the beam is in a correct position for writing on the PC board. Thus, for periods during which the beam changes facets or during the beginning or end of the scan, when the beam is not in a writing position, no data is sent to the modulator, which is shut off.

Clock generator 102 sends an x-clock signal and a start of scan signal to a data base 104, which contains a binary map of the PC board to be scanned. Alternatively, the data could be in vector form and could be transformed to raster form on-line. This data is preferably in compressed form. The generation of the start of scan signal may be based on a separate detector, which sends a start of scan signal (not shown) to the clock generator. Preferably, the start of scan signal is based on the scan signal itself, for example by long signals generated at the beginning and/or end of a scan.

Clock generator 102 also sends a y-synch signal to a controller (not shown) This controller controls movement of the table in synchronism with the y-scan signal. This signal, which is synchronized with the start of scan, provides a means for synchronizing the position of the table with the data stream.

Data base 104 send a plurality of scan lines of data to a multi-line data buffer and scan line generator 106. Preferably, multi-line data buffer 106 contains all of the lines of data required for the present scan and for the next scan.

Based on a cross-scan position signal and PC board position information, the multi-line data buffer and scan line generator generates scan line data and transfers the scan line data to scan line buffers and control 108. This data is fed to the various modulators one bit at a time in response to the clock, starting at a time dependent on the start of scan signal.

Figure 10A:
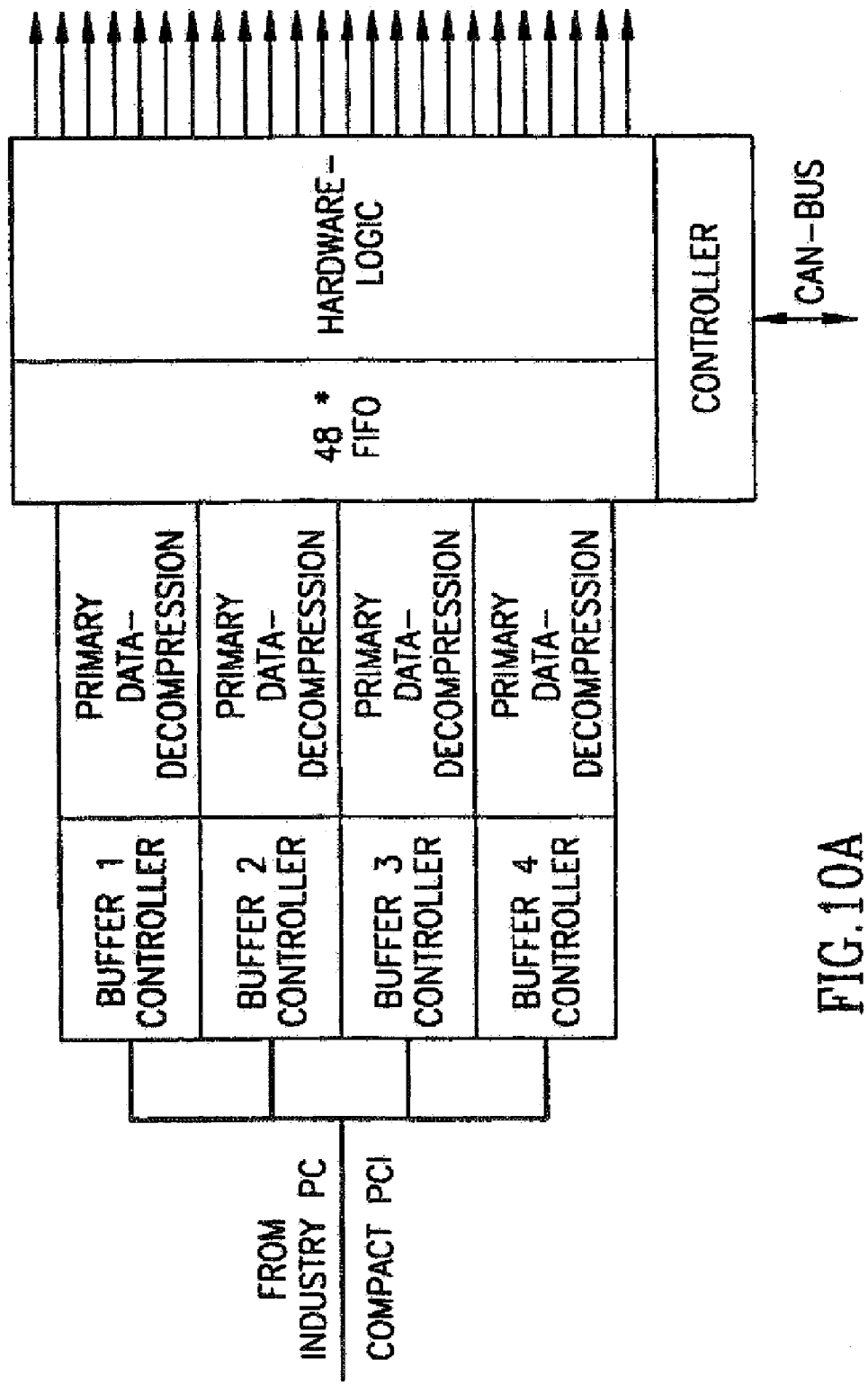
FIG. 10A is an overall block diagram of portions of the system of FIG. 9, in accordance with a preferred embodiment of the invention.
Figure 10B:
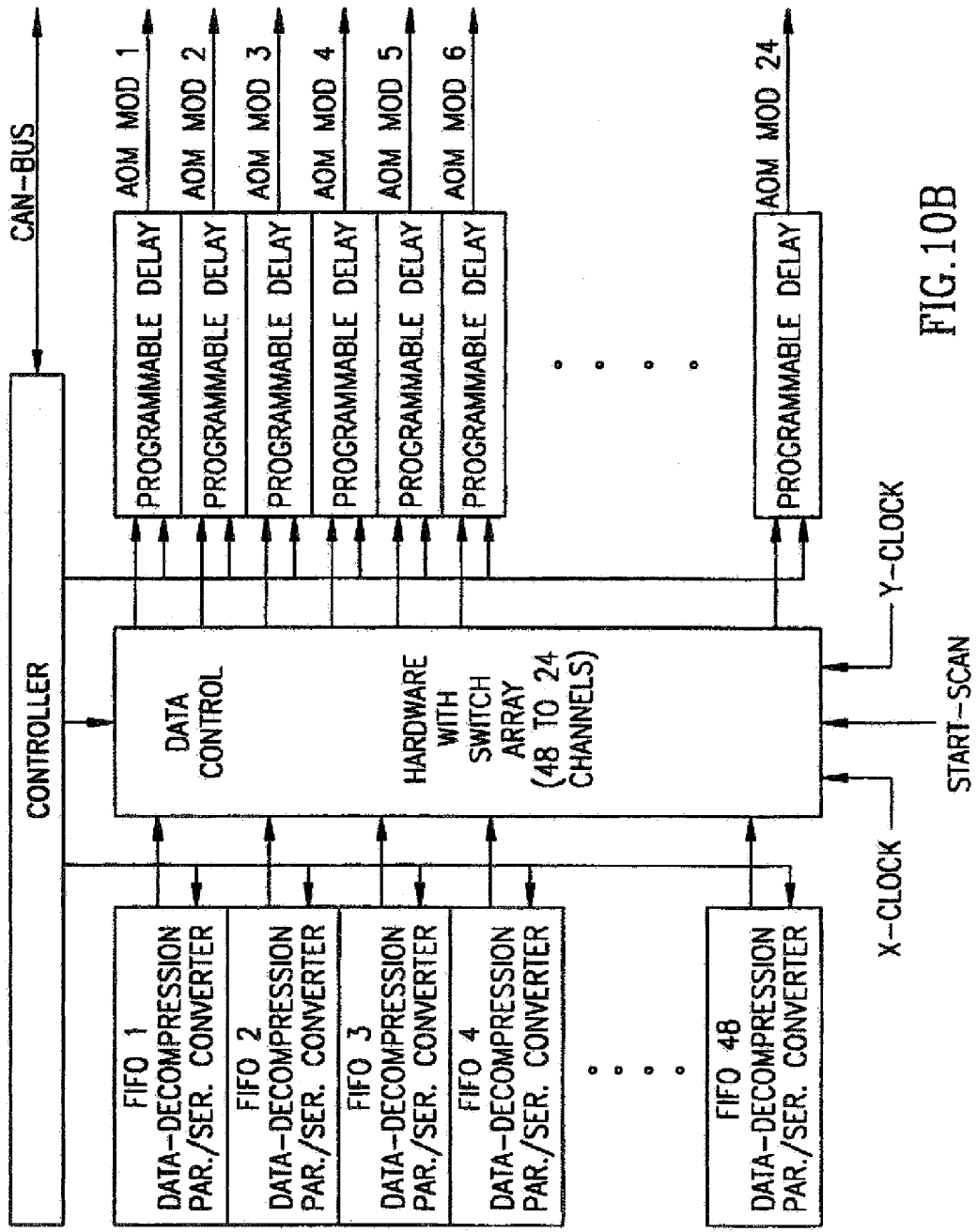
FIG. 10B shows an implementation of hardware logic of FIG. 10A, in accordance with a preferred embodiment of the invention.
Figure 11:
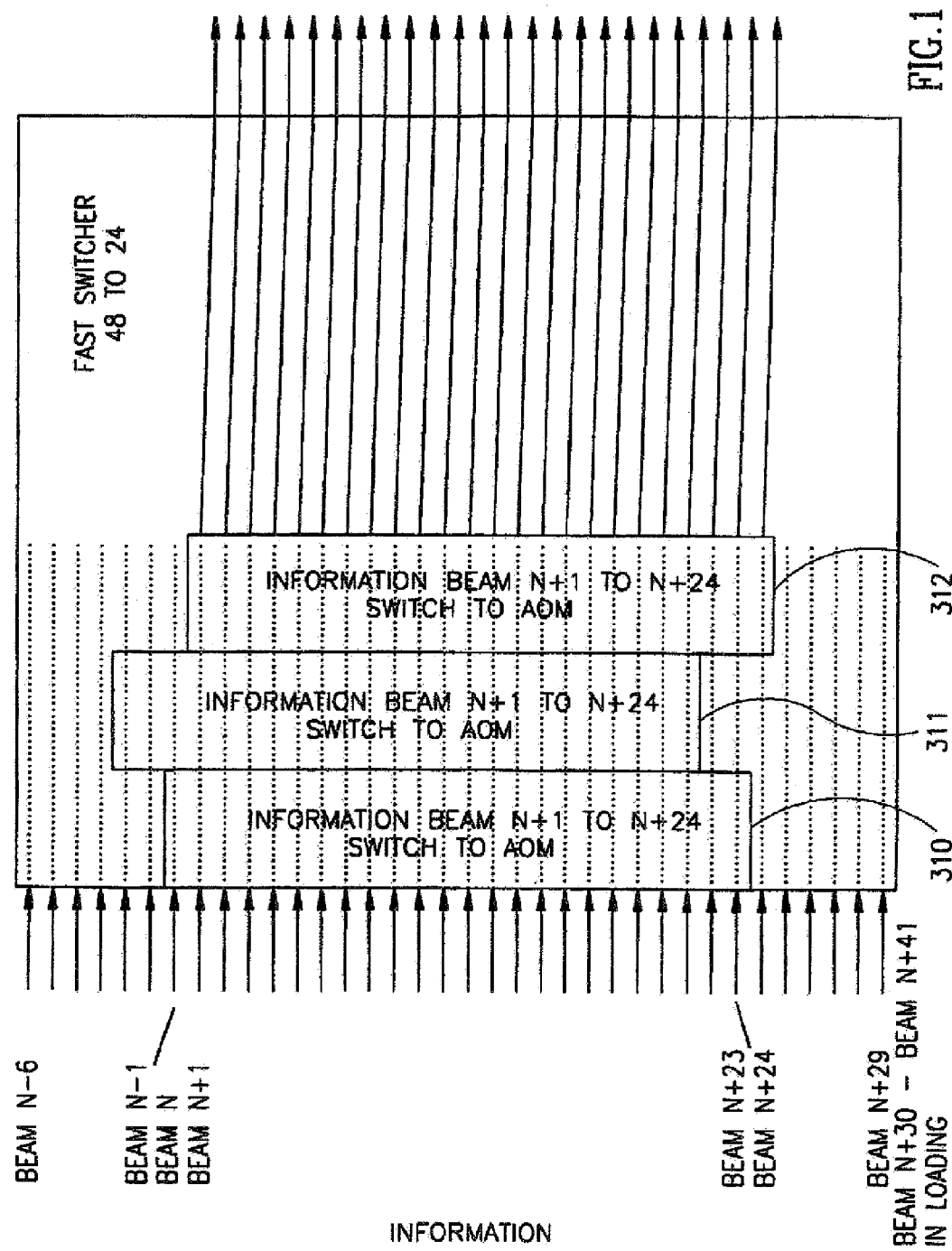
FIG. 11 illustrates the operation of a portion of the circuitry of FIG. 10B in which data lines are sent to acousto-optic modulators, based on scan control signals, in accordance with a preferred embodiment of the invention

It should be understood that FIG. 9 represents only a functional block diagram and a variety of apparatus and methods for carrying out the functionality of FIG. 9 will occur to persons of skill in the art. Furthermore, some of the functions associated with one of the block may be carried out by another of the blocks or blocks may be combined in practice. Furthermore, all or some of the functions may be carried out in hardware, software or firmware or in combinations of hardware, software or firmware and/or on general or special purpose computers. In general however, for very fast systems, dedicated hardware systems are desirable. Such systems will generally use hardware data decompression, FIFOs for holding the data, switches for switching the data from the FIFOs to the beams and programmable delays for delaying the data based on the position of the printed circuit board. A general view of such a system (for generation of 36 scan lines, only 24 which are actually written to the acousto-optic modulator (AOM) and 12 lines of which are used for the cross scanning correction, described below) is shown in FIG. 10A shows an overall block diagram of buffer/generator 106 and scan line buffer and control 108, in accordance with a preferred embodiment of the invention. FIG. 10B shows an implementation of the hardware logic of FIG. 10A. FIG. 11 illustrates how the fast switcher of FIG. 10B is operative to control which data lines are sent to the AOMs, based on the scan control signals described above. The system allows for up to a 6 scan line offset for the modulator signals in each direction.

It should be noted that the fast switcher shown in FIG. 11 allows for the correction of cross-scan errors that are related to scan position. Such errors may be caused, for example, by residual aberrations in the scanning optics. Such errors do not change with time and can be measured once in the lifetime of the scanner. These errors are stored in a memory and form the basis for signals to the fast switcher.

In particular, FIG. 11 shows 36 data input streams, shown in FIG. 11 as beams entering the switching system and 24 output data streams, each corresponding to a beam modulation channel in modulator 28, leaving it. (For the system of FIG. 6, 30 beams would leave the system.) The incoming data streams correspond to a given scan line on the board according to according to its nominal position. Also shown in FIG. 11 are three boxes 310-312 which designate three exemplary "positions" for the switcher. Each box 310-312 corresponds to an exemplary cross-scan offset position of the beam on the board for the given scan position, such as may arise due to imperfections in the scan optics. In position 310, the cross-scan offset is zero. In this case input lines N=0 to N=23 are sent to the modulator. A reference 311 designates the situation in which the beam is offset by two scan lines in the cross-scan direction. To compensate, input lines N=−2 to N=21 are sent to the modulators so that sub-beams are modulated by data from these input lines. This assures that even though the beam moves in the cross-scan direction during the scan, the information is written in the proper positions on the board. Similarly a reference 312 represents the situation in which the offset is in the opposite direction by one scan line, such that input lines N=1 to N=24 are sent to the modulator.

Figure 12:
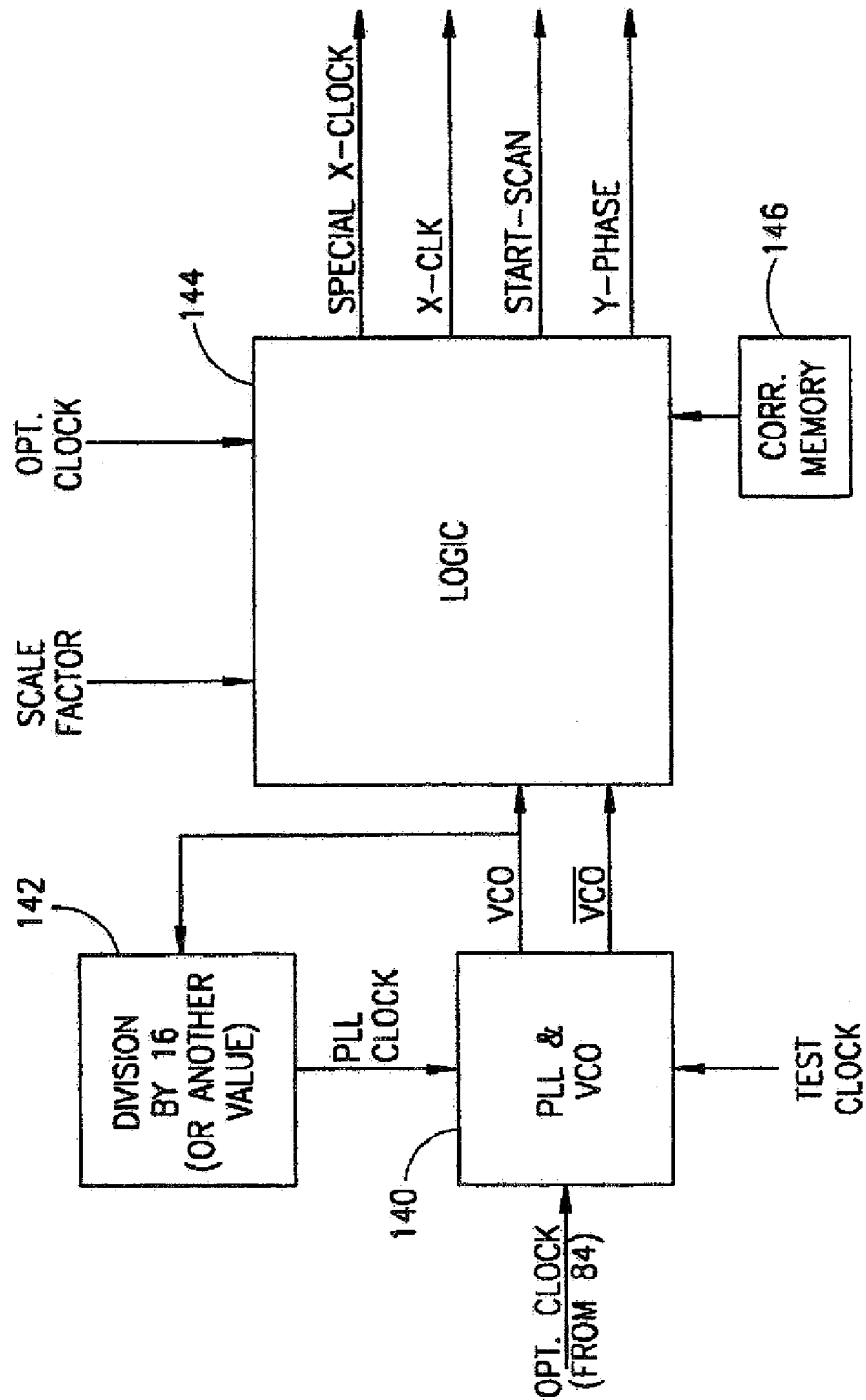
FIG. 12 is a block diagram of apparatus useful for providing a data clock, in accordance with a preferred embodiment of the invention.
Figure 13:
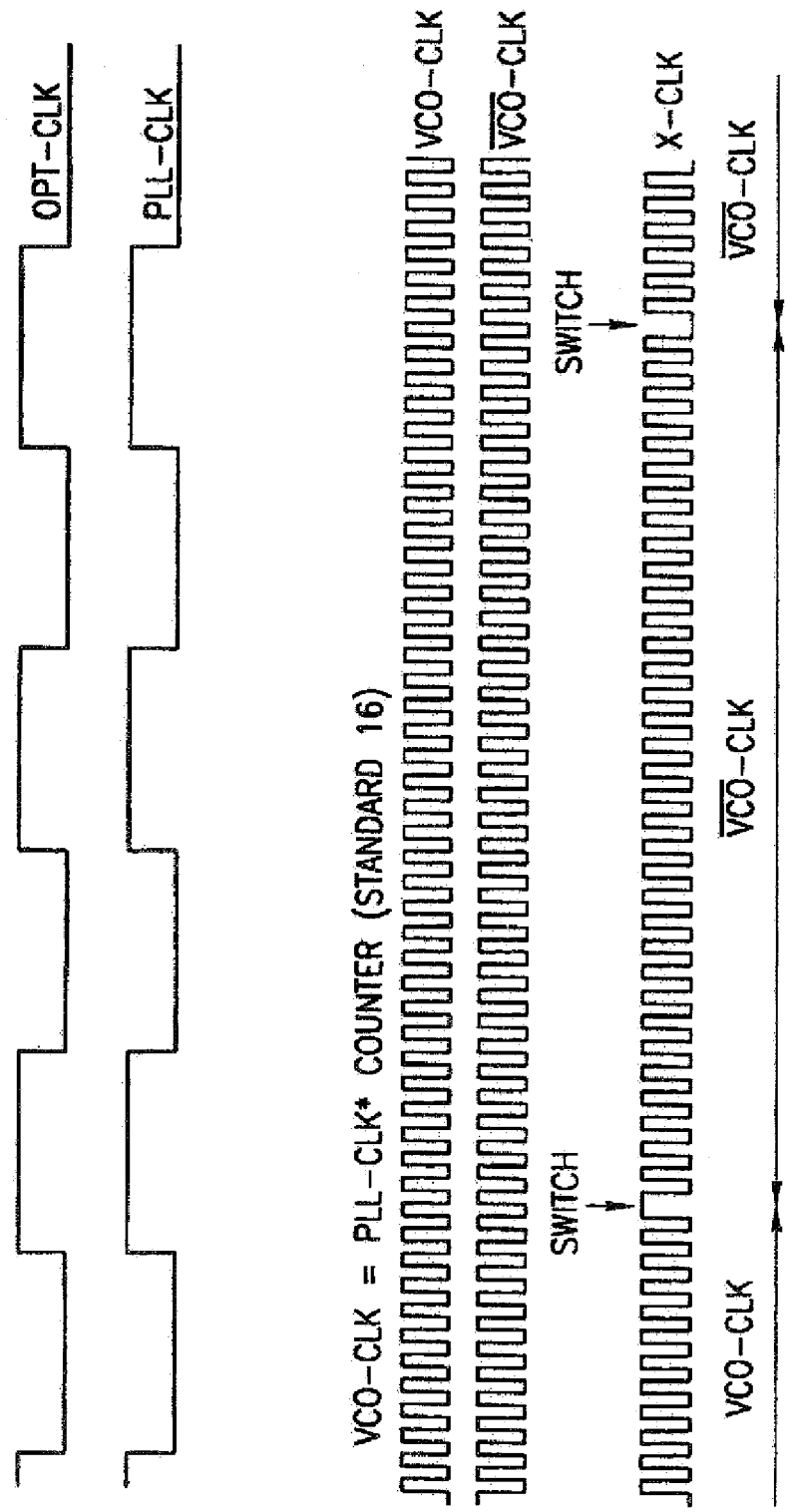
FIG. 13 shows some clock pulses, useful in understanding the apparatus of FIG. 12.

FIG. 12 is a schematic drawing of clock generator 102 circuitry for producing the X-clock, in accordance with a preferred embodiment of the invention. While this circuitry and the method it performs are preferred, it should be understood that other methods of producing a high rate clock from a low rate signal, as known in the art, may be used in other embodiments of the invention. FIG. 13 illustrates clock signals useful in understanding the operation of clock generator 102.

The optical clock signal from detector circuitry 84 is used to provide a locking signal for a PLL and VCO 140. PLL and VCO 140 form a loop with a division by 16 circuit 142 to produce a VCO signal based on a PLL signal which is similar to the optical clock. The PLL clock differs from the optical clock (opt-clock) in the following ways:

1) The PLL-clock is more stable (very short term) than the opt-clock.
2) The PLL clock has sharper and more stable transitions than the opt-clock.
3) The PLL-clock is continuous. The opt-clock disappears during facet switching. When the opt-clock reappears, the PLL locks the PLL clock to the opt-clock. For several cycles a phase difference may exist. However, no data is triggered during this period, as the beam is at the beginning of the scan when no data is yet to be written.

The PLL and VCO 140 produces two clocks (VCO and inverse-VCO), both of which are 16 times as fast as the PLL clock and the optical clock. Standard circuitry may be used for this division. Using an AD9850BRS (available from Analog Devices Corp. of USA) to perform the division, other divisions (such as 15,999 or 16.001) can be achieved with a 40 bit accuracy. This makes it possible to generate any required linear scaling.

The VCO clocks are used by logic circuits 144 to produce the start scan signal and a Y-phase signal. Logic circuits 144 also receive a scale factor and scan corrections values from a scan correction memory 146.

In preferred embodiments of the invention, the VCO clock as generated by the scale has a slightly higher frequency than the actual desired data stream frequency to the modulators. This built in error and other errors of the system are corrected by a clock generating scheme illustrated in the clock trace of FIG. 13. It will be noted that the signal shown in this line utilizes both the VCO clock and the inverse-VCO clock to form the X-Clock (the data clock). It will be noted that each pair of switches between the clocks results in the loss of a single count. Thus, with the count frequency of the VCO clock set purposely high, it is possible to reduce the frequency, to the extent necessary, to the required frequency. Logic 144 produces a frequency of switches sufficient to correct for the following:

1) The purposely high VCO frequency caused by scale predistortion. This frequency may be about 0.75% high.
2) A scale factor of the boards, as described below.
3) Position errors between the scale measurement and the position of the writing beam. These errors occur primarily because the two beams do not follow the same path and the scanning lens, while telecentric, has some residual non-telecentric errors. Thus, the offset between the beams and the different length of the beams results in some small repeatable errors. The value of these errors is stored in correction memory 146.

The logic also generates a start scan signal, preferably from the optical clock itself, as described above. This signal is supplemented by a y-phase signal which determines the actual synchronization between the polygon and the y motion of the table.

It should be understood that for simplicity of explanation, other data corrections have not been described. Preferably, however, known errors in the scan readings are taken into account in determining the data sent to the modulator. A further correction is made for a timing delay between the electrical clock based data switching and the impingement of the optical beam on the board. As a result of the timing delay there will be an additional positioning delay in the scanning direction depending for example on the current polygon speed. In a preferred embodiment of the invention an autoalignment mechanism based on the position measurement system, as described below (FIG. 14) is used.

At a table position outside of the area of light guide 152 (FIG. 14), preferably where the board is not under the beam, a data signal is sent at a known X-Clock position. However, delays in the electronic system and especially in the switching time of modulator 28 will produce modulation at the board, at an offset time from when the data is sent. This results in a positioning offset error at the board. This positioning error is mainly a factor of the polygon speed. To measure the position offset after changing polygon speed, a data signal is sent to the modulator at a fist x-position and the light signal from the light pipe is received at a second x-position.

The number of X-Clock pulses between first and second positions now represents a timing delay and is used as an additional delay for X-Clock generator.

It should be understood that several timing delays at several X-Clock positions may be used to provide better accuracy.

The system also preferably includes a test clock used to test the circuitry without having to turn on the laser.

PC Board Alignment

In accordance with preferred embodiments of the present invention, alignment of the data to the board is with reference to through holes, as in the prior art. Writing on boards in an absolute position is particularly important when writing on boards that have already been written on, such as the second side of a layer to be used within a multi-layer board or the outside of a multi-layer board. However, unlike the prior art systems in which the holes on the board were mechanically aligned with the scanner, in preferred embodiments of the invention, the holes on the board are optically aligned with the scan data. Preferably, the system used for writing on the printed circuit board, including the scan and cross-scan positioning mechanism is utilized for determining the precise position of the holes and hence of the board on the scanner. In preferred embodiments of the invention, the data is matched to the position of the board by rotating the board to correct for angular misalignment of the board with the data and/or by selective delays of the scan line data in both the scan and cross-scan directions, to correct for residual scan positional misalignment. Preferably, cross-scan misalignment is corrected by delaying or advancing the data in the cross-scan direction. Generally, all three corrections are carried out.

In an alternate preferred embodiment of the invention, the data itself is transformed to the measured coordinate system by rotating and translating the data to match the measured position. However, it is difficult to make these transformations on-line, so that the hybrid alignment of the data with the position, described above, is preferred for high throughput scanners where on-line transformations from the data base is desirable.

Figure 14:
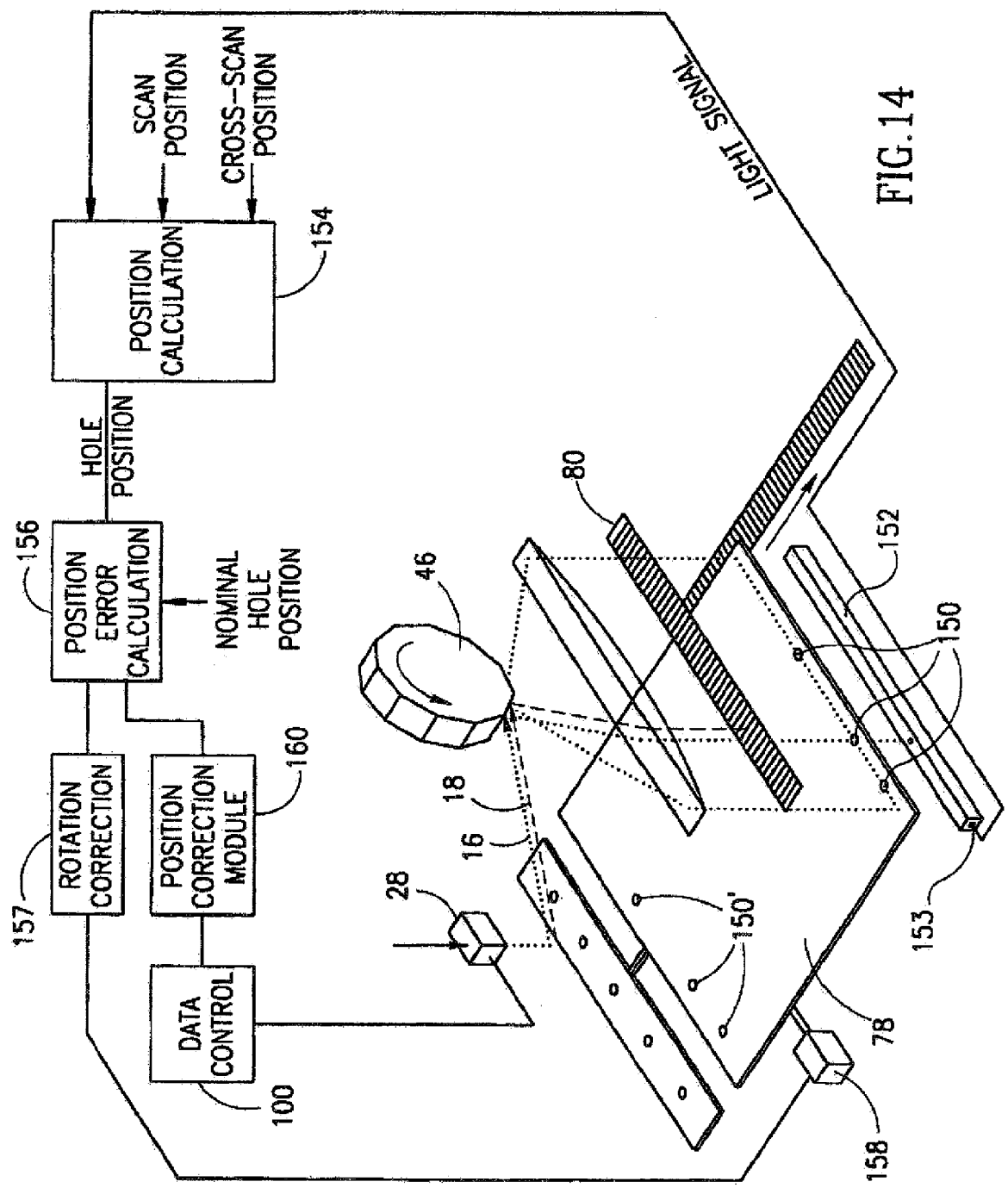
FIG. 14 is a schematic drawing illustrating a method for precisely determining the position of a printed circuit board in a scanner, in accordance with a preferred embodiment of the invention.

FIG. 14 is a schematic representation of a position measurement system, in accordance with a preferred embodiment of the invention. PC board 78 is formed with a plurality of holes 150, preferably with three holes as shown. Table 79 is not shown in FIG. 14, but it is also formed with holes underlying and somewhat larger than holes 150. Beneath the table a light guide 152, coated on top with a fluorescent material, receives light that passes through the holes and illuminates a detector 153 with the light. When the beam passes through a hole, detector 153 will produce a signal. When the beam is blocked by the PC board, detector 153 produces no signal. The signal from detector 153 is fed, together with the beam x-position and the beam y-position into a position calculator and memory 155. The position calculator and memory determines the edge of the hole from the positions of the beam (both scan and cross-scan directions) when the signal changes from off to on and from on to off. From this edge, the actual position of the center of the holes is determined.

The center position of all three holes 150 is sent to a position error calculator 156. Calculator 156 also receives (or has in storage) a nominal position of the holes. Based on the difference between the actual and nominal positions of the holes, a rotation correction unit 157 determines a required rotation for the table. A rotation mechanism 158 accurately rotates the table by a desired amount prior to scanning in order to align the x-y axes of board 78 to the respective axes of the scanner system. In addition, a position correction module 160 determines a relationship between the position of the table and the position of the area to be written. This relationship is used to correct the position of the data sent to modulator 28 by data control 100.

In addition, a scan direction scale factor (shown on FIG. 12) may be calculated based on a difference from nominal of the distance between the holes. In a preferred embodiment of the invention, additional holes 150' may be provided, such that the cross scan distance between holes 150 and holes 150' may be determined. This distance (compared to a nominal distance) may be used to scale input data in the cross-scan direction. Alternatively, the same scale factor can be used in both directions. This scale correction is used when actually writing on the PC board to scale the data as described above.

It is not desirable to expose the photoresist on board 78 during the hole position determination. This can be achieved by either reducing the power so that the beam 16 is not powerful enough to expose the photoresist or by limiting the irradiated region to the region of the holes, which are not part of the pattern to be written.

It should be understood that FIG. 14 is very general in nature and is generally functional. Other electronic structures may be useful to carry out the position determination or they may be carried out in whole or in part in software or firmware.

In practice, after one side of the board is written, the board is turned over. The left most hole of FIG. 14 has moved near to the right edge of the table and is placed over an additional hole in the table at its new position. The middle holes, which are preferably symmetrically placed, just switch positions. Again the positions of the holes are calculated and the second side is written using the respective positions of the holes as a reference to determine the positions, corresponding to the pattern written on the first side, at which the pattern for the second side should be written. It should be noted that asymmetric positioning of the holes results in automatic detection of the side of the board.

In general, a number of layers would be exposed in this manner and then etched. In general, when layers (even different layers) are produced in a batch, the dimension change for all of them will be about the same. The layers are stacked, preferably using the holes as a guide, but using other means, such as X-ray images as known in the art, to align the layers, which are then laminated to each other. Outer layers (which are, at this point completely covered, on their outside, with copper) are part of the stack. As in the prior art, holes for vias and/or mounting are drilled, for example based on X-ray images. Preferably, holes suitable for use in aligning the stack for writing on the outside layers are also drilled. These holes may be used to align the data for the outsides of the board with the patterns written on the inner layers. It should be noted that the scale factor for the stack is usually different from that for the layers, due to pressure caused distortion in the stacking and attachment process.

While this method of positioning is preferred, for some preferred embodiments of the invention other alignment methods, such as mounting holes (in the boards) and pins (on the table) may be used.

Optionally, the table may be supplied with positioning pins and the board with holes used to roughly align the boards, prior to the application of the above position determination and correction methodology. In this manner, the required rotational corrections and the data position corrections are minimized.

In a preferred embodiment of the invention, light guide 152 is 10 mm high by 10 mm wide. Preferably, only a single beam segment is illuminated. The beam may be focused at the PC board or alternatively the beam may be purposely defocused so that the "optical edge" is not sharp. This would result in a ramp function for the light, as a function of position. Such functions can be used to determine the position of the edge to sub-pixel dimensions, from a plot of brightness as a function of position. In an alternative preferred embodiment of the invention (not shown) individual detectors, one beneath each hole are used instead of guide 152 and detector 153.

Determination of Cross-Scan Errors

As indicated above two types of cross-scan errors are to be determined and corrected. One of these is the cross-scan position error which may vary as a function of polygon angular position and is corrected utilizing the methodology discussed in conjunction with FIG. 11. The other is cross-scan angular and slowly varying offset which are corrected as described in conjunction with FIG. 7B.

Incorrect placement of the beam in the cross-scan direction, at acoustic modulator 28 may be determined relatively easily. To make this determination, the beam is scanned across light pipe 152 (in the absence of the table) and the signal from detector 153 is measured. This scanning is repeated a number of times with either successive ones or small groups of scan lines being activated. If the beam is correctly placed at the modulator, a plot of the beam power as a function of modulator segment number will have a Gaussian shape centered between the middle two segments. If it is offset from the center of the modulator (whether extra channels as in FIG. 6 are provided or not) the center of the Gaussian shape will be offset. This offset may be determined by determining the center of a fitted Gaussian to the plot of beam power as a function of modulator segment.

Figure 17A:
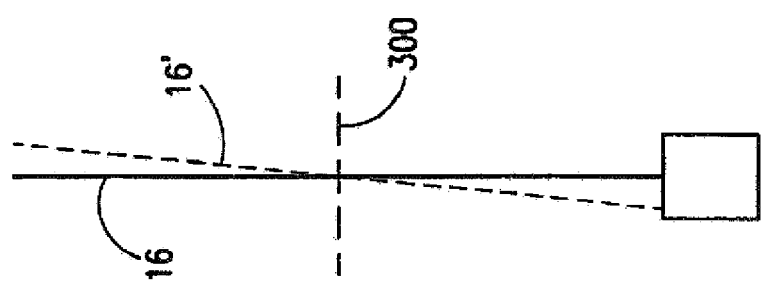
FIGS. 17A and 17B show side and top views respectively of a part of the scanner used in determining certain cross-scan errors.
Figure 17B:
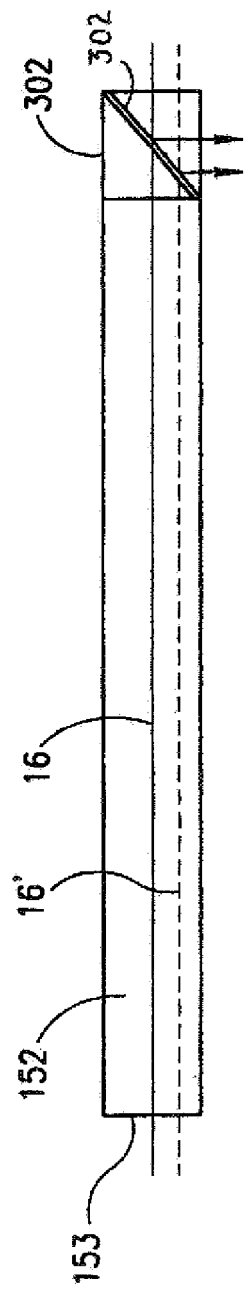

FIGS. 17A and 17B are side and top views of a portion of the scanner used in a preferred method for determining cross-beam angular offset. In FIG. 17, the elements are given the same numbers as in earlier Figs., with new elements 300 signifying the focal plane and 302 signifying a fiducial for angular shift.

As seen in FIG. 17A, an angular error will manifest itself in an offset in the cross-scan direction, of the position at which the beam contacts light guide 152. Fiducial 302 preferably comprises an opaque material in which a slit 304 is formed. Slit 304 is placed at an angle to the scan and cross-scan directions. It will be noted (from FIG. 17B) that the position of the beam in the cross-scan direction is different at the focal plane and on the light guide. This difference in position in the cross-scan direction is transformed into a difference of time (and thus position in the scan direction) by slit 304. As indicated, a pulse will be collected by detector 153 from the fiducial only when the beam crosses the fiducial. This scan position may be measured using the x-position measuring system, including scale 80 which measures position at the focal plane. The angular offset can be derived from the error in position (time) of the received pulse.

It was noted above that wobble of the polygon causes no appreciable movement of the beam in the cross-scan direction, by design of the optical system.

The Scale

Scale 80 has a number of features to improve the accuracy and reliability of the position measurement. As already mentioned, the facet cuts a portion of light out of the expanded Gaussian distributed test beam 18. As a result, the total power of the forward beam is lower in the outer portions of the scan than in its center. Furthermore, as the scanning lens isn't completely telecentric, the beam is reflected in a different direction, in the scan direction, from the incident beam. As a result, the reflected beam does not impinge on the facet in the same position as the incoming beam. The reflected beam is then cut again by the facet, depending on the telecentric error.

The telecentric error characteristics usually have the general form $\Theta=a*X+b*X^3$, where $\Theta$ is the telecentric error, X is the scan position, symmetrically measured from the center of the scan, and a and b are constants.

To overcome this problem, in a preferred embodiment of the invention, the surface of the scale is contoured, in the scan direction, such that the beam is reflected in the same direction as the incident beam (i.e., perpendicular to the scale). This can be achieved if the scale has a surface with a contour having the form $Z=c*X^2+d*X^4$, where Z is the deviation from flatness of the scale. However, due to focal depth considerations, the offset is limited to about 0.5 mm.

However, this correction is not complete. As a result, at some scan positions, especially in the middle of the scan, the amplitude of the signal based on the reflected beam is in saturation and the on period is substantially greater than the off period. In other positions, especially at the ends of the scale, the off period is greater than the on period. Since the generation of the data clock is conveniently based on thresholding the signal, this can lead to timing errors, especially if the off period amplitude does not fall below the threshold or the on period amplitude does not rise above it. In a preferred embodiment of the invention, the sizes of the reflecting and non-reflecting portions of the scale are varied with position, such that the on and off periods of the signals are the same.

Vacuum Chuck for the PC Board

During the cycle of measurement of position and scanning, it is important that the printed circuit board remain in place. This problem is complicated by the fact that, even when positioning pins are used, they are not accurate enough for positioning. Thus, a vacuum chuck is preferably used to hold PC board 78 in place on table 79.

Figure 15:
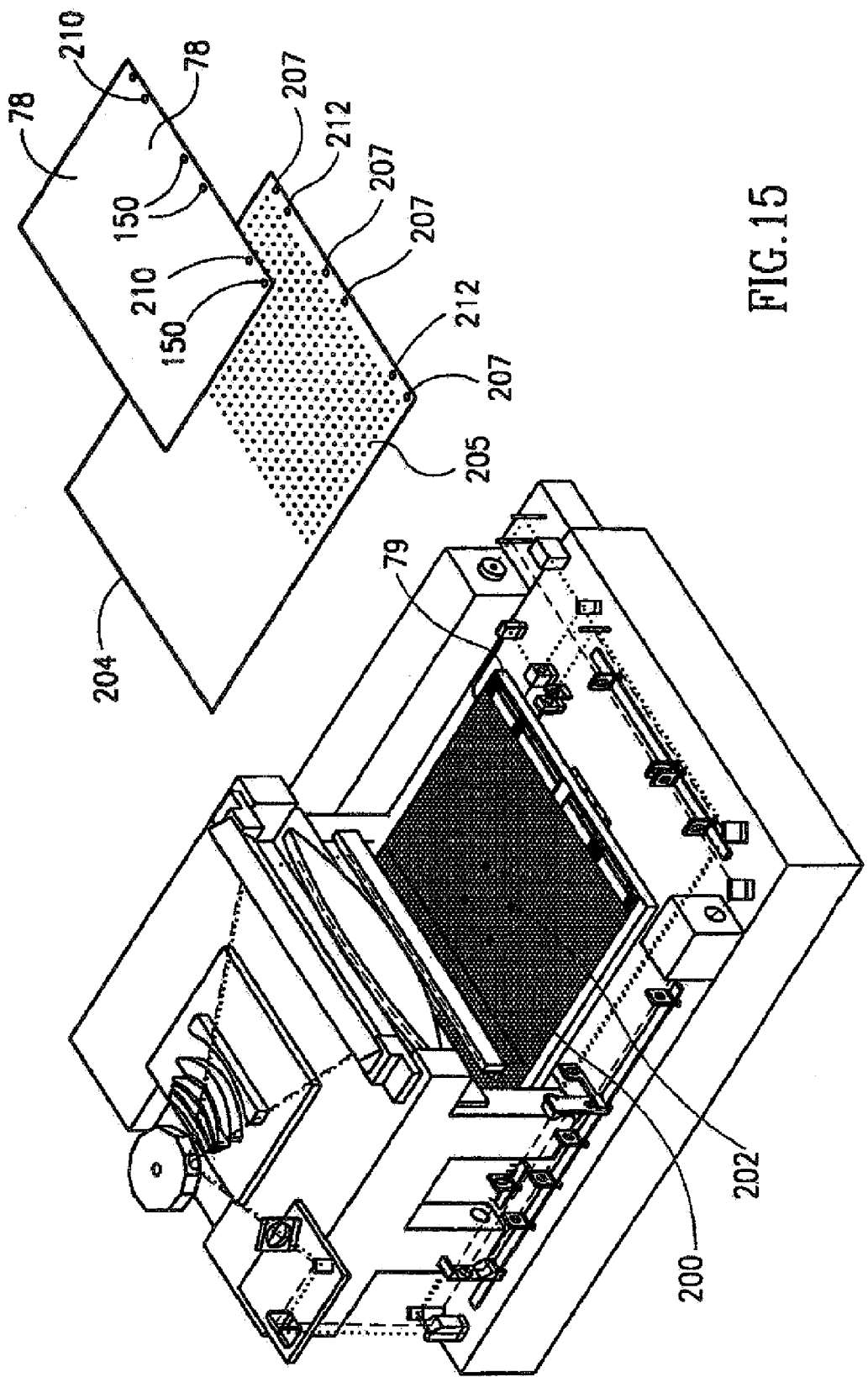
FIG. 15 shows a scanner system including a universal part of a vacuum chuck for holding printed circuit boards as well as a specific adapter for holding a printed circuit board, in accordance with a preferred embodiment of the invention.

FIG. 15 is a perspective view of the scanner of FIG. 1 with table 79 in an extended position and PC board 78 removed from the table. Table 79 is formed with a segmented surface 200, shown more clearly in FIG. 16. Segmented surface 200 is preferably formed of a series of truncated pyramids, with the tops of the pyramids forming a flat surface. Surface 200 is further formed with one or more vacuum outlets 202 from which air can be pumped in either direction. If the entire surface is covered and air is pumped out through outlets 202, the vacuum thus formed is distributed throughout the channels between the pyramids and the entire surface of the covering is held down by the vacuum.

In practice, most PC boards can not be placed directly on the truncated cones, since most PC boards are smaller than the entire surface. Thus, any potential vacuum would escape at the edges of the boards. Furthermore, many PC boards have holes drilled in them before they are exposed, so that vacuum would escape through them as well.

In accordance with a preferred embodiment of the invention, an intermediate plate 204 is placed between surface 200 and PC board 78. Plate 204 is designed to act as a vacuum distributor for a specific design of PC board. Plate 204 will typically have a large number of holes 205, but only in areas to be covered by solid regions of the PC board.

Figure 16:
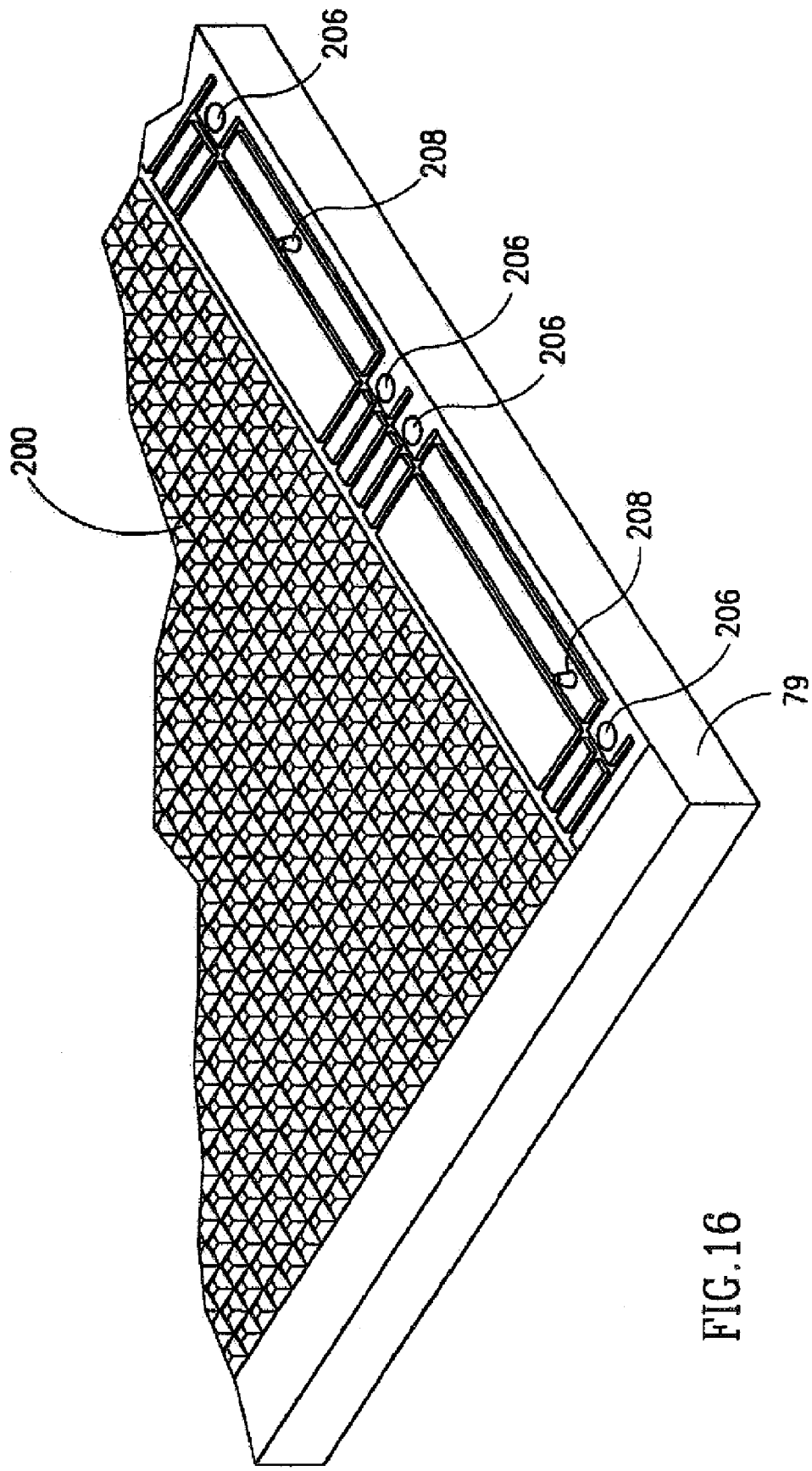
FIG. 16 shows details of the permanent portion of the vacuum chuck of FIG. 15.

It will be noted from FIGS. 15 and 16 that the end of table 200 has a different structure from that of surface 200. Preferably, where a position measurement system described above is used, the table will be formed with holes 206 corresponding to holes 150 on the printed circuit board and holes 207 formed in plate 204. It should be understood that holes 206 and 207 are substantially larger than holes 150, so that they do not interfere with the alignment of board 78 described above. It will also be noted that optional pins 208 are provided on the top of table 79 for rough positioning of the PC board. These pins mate with holes 210 in PC board 78 and 212 in plate 204.

It will also be noted that due to the presence of holes in the table, the truncated pyramid structure is not used for the end of the table. Rather, a series of channels, connecting to the valleys of the pyramids is preferably used to provide hold-down vacuum at the end of the table.

In accordance with a preferred embodiment of the invention, removal of the PC board, after writing is completed is aided by the provision of compressed air to the bottom of the board via holes 202 and valleys of the pyramids. This compressed air lifts the board slightly making it easier to remove.

A vacuum chuck as described above has the further advantage that the entire board is pressed toward and referenced with a flat surface (the truncated tops of the pyramids). Thus, the entire board is at the same focal plane.

It should be understood that the detailed description of the preferred embodiment of the invention, described above, is intended to be exemplary in nature and not to be limiting. In particular, the preferred embodiment contains many features and details that are not absolutely necessary for the invention, although they may provide for optimum operation of the system. Furthermore, while particular circuitry and other structure is disclosed for the preferred embodiment, it will be evident to the skilled reader that other structure may be substituted for the described structure. Furthermore, it should be understood that the term printed circuit board, as used herein also includes other large similar structures, such as flat panel displays, which are written on by similar techniques. Finally, the described apparatus and method include many ideas and aspects which, even when closely related, may be separately applied to practical scanning systems. It should not be inferred, based on the detailed description, that these ideas and aspects must be applied together, nor should the use of section heading be considered to limit the scope of the invention.

As used in the disclosure and claims, the terms "comprise" or "include" or their conjugates mean " including but not limited to".

The invention claimed is:

1. Apparatus for holding flat plates of varying sizes, comprising:
   a base section having a flat surface and including plurality of interconnected channels formed on the surface thereof;
   at least one port connecting to said channels;
   a vacuum source connected to the at least one port; and
   an intermediate plate defining a flat surface and covering substantially all of said channels, said intermediate plate having a multiplicity of holes formed therethrough and being held down to said base section by said vacuum, said holes being arranged to be covered by a flat plate that is to be held to said flat surface of the intermediate plate and to act as a distributor of a vacuum formed in the interconnected channels to hold the flat plate to the flat surface of the intermediate plate;
   wherein at least a portion of the base section comprise an array of truncated pyramids, flat tops of said pyramids comprising the flat surface of the base section and areas between the pyramids comprising the channels of the base section.

2. Apparatus according to claim 1 wherein the density of said holes is sufficient to hold said plate flat against said flat surface of the intermediate plate by means of a vacuum force provided by said vacuum source.

3. Apparatus according to claim 1 wherein said intermediate plate is adapted to have a multiplicity of holes only in areas covered by solid regions of a printed circuit board.

4. Apparatus according to claim 2 wherein said ones of said areas between said truncated pyramids are substantially larger than ones of said holes.

5. Apparatus according to claim 1 wherein said interconnected channels extend in at least two non-parallel directions.

* * * * *